(12) United States Patent
Erb

(10) Patent No.: US 11,716,067 B2
(45) Date of Patent: Aug. 1, 2023

(54) MATCHING CIRCUITS FOR PHASE CHANGE MATERIAL SWITCHES

(71) Applicant: pSemi Corporation, San Diego, CA (US)

(72) Inventor: Jean-Luc Erb, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 0 days.

(21) Appl. No.: 17/483,461

(22) Filed: Sep. 23, 2021

(65) Prior Publication Data
US 2023/0090893 A1 Mar. 23, 2023

(51) Int. Cl.
*H03H 7/38* (2006.01)

(52) U.S. Cl.
CPC ..................................... *H03H 7/38* (2013.01)

(58) Field of Classification Search
CPC .......... H03H 7/38; H03K 17/693; H01P 1/15; H01L 45/1286; H01L 45/06; H01L 45/144; H01L 45/1206; H01L 45/1226; H01L 45/143; H01L 45/126; H01L 45/16; H01L 45/1233; H01L 45/148; H01L 45/1625; H01L 45/065; H01L 45/1641; H01L 45/1675; H01L 45/1293; H01L 27/24; H01L 45/1253; H01L 23/66; H01L 45/128; H01L 45/1608
See application file for complete search history.

(56) References Cited

U.S. PATENT DOCUMENTS

| | | | |
|---|---|---|---|
| 9,293,699 B1 | 3/2016 | Moon | |
| 11,031,555 B2 | 6/2021 | El-Hinnawy et al. | |
| 2014/0191181 A1* | 7/2014 | Moon | H01L 45/1206 257/4 |
| 2020/0058848 A1* | 2/2020 | El-Hinnawy | H01L 27/2463 |
| 2020/0059219 A1 | 2/2020 | El-Hinnawy et al. | |
| 2020/0161548 A1* | 5/2020 | Masse | H10N 70/8828 |
| 2022/0263536 A1* | 8/2022 | Beglin | H04B 1/44 |

OTHER PUBLICATIONS

Slovin, et al., "Multi-Throw SPNT Circuits Using Phase-Change Material RF Switches for 5G and Millimeter Wave Applications," 2021 IEEE MTT-S International Microwave Symposium (IMS), 2021, pp. 428-430, doi: 10.1109/IMS19712.2021.9574818.

(Continued)

*Primary Examiner* — John W Poos
(74) *Attorney, Agent, or Firm* — Jaquez Land Greenhaus & McFarland LLP; John Land, Esq.

(57) ABSTRACT

Circuits and methods that provide wider bandwidth and smaller IM inductances for phase change material (PCM) based RF switch networks. The present invention recognizes that it is beneficial to consider the total high parasitic capacitance to ground of the various PCM switches in an RF switch network as constituting two or more separate capacitive contributions. This leads to several "split capacitance" concepts, including signal-path splitting, switch-block splitting, stacked-switch splitting, and splitting parasitic capacitances due to layout discontinuities, in which compensating impedance matching inductances are inserted between additive capacitances.

20 Claims, 23 Drawing Sheets

(56) References Cited

OTHER PUBLICATIONS

El-Hinnawy, et al., "Switch Stacking for OFF-State Power Handling Improvements in PCM RF Switches," 2021 IEEE MTT-S International Microwave Symposium (IMS), 2021, pp. 424-427, doi: 10.1109/IMS19712.2021.9574954.

F. Amin et al., "Wideband SPDT and SP4T RF Switches using Phase-Change Material in a SiGe BiCMOS Process," 2021 IEEE MTT-S International Microwave Symposium (IMS), 2021, pp. 431-434, doi: 10.1109/IMS19712.2021.9574962.

Rebeiz, Baltimas, Jul. 2019 SBC18H3PC MPW B4058 Measurement Results/Final Report, U.C. San Diego, Jacobs School of Engineering, Jul. 16, 2020, 37 pgs.

Silva, Joao Carlos, International Search Report and Written Opinion received from the EPO dated Jan. 12, 2022 for appln. 10. PCT/US2022/075267, 9 pgs.

\* cited by examiner

OFF state

ON state

MATCHING CIRCUITS FOR PHASE CHANGE MATERIAL SWITCHES

BACKGROUND

(1) Technical Field

This invention relates to electronic circuitry, and more particularly to phase change material (PCM) switches.

(2) Background

Phase-change materials have been used to fabricate integrated circuit (IC) switches that can be thermally transitioned between a high-resistivity amorphous OFF state (e.g., having a resistivity ρ of about 10 Ω-m) and a low-resistivity crystalline ON state (e.g., having a resistivity ρ of less than about 2 μΩ-m). A PCM switch consists of a volume of phase-change material (PCM) having two electrical terminals and an adjacent heater, such as a resistor.

FIG. 1A is a diagram of a prior art electrical symbol 100 for a PCM switch, and a (roughly) equivalent single-pole, single-throw switch symbol 102. The electrical symbol 100 stylistically shows a region of PCM 104 (marked with a "delta" symbol to indicate "change") and an adjacent heater, which is generally a resistive heater $R_H$. Precisely controlled electrical power profiles are applied to the resistive heater $R_H$ to generate different thermal profiles that result either in amorphizing the PCM region 104 into a high resistance state (OFF or open) using a higher-power, short-period pulse, or crystalizing the PCM region 104 into a low resistance state (ON or closed) using a lower-power, long-period pulse.

FIG. 1B is a stylized cross-sectional view of a portion of an IC showing the physical structure of a PCM switch 110. Within an insulating layer 112, a region of PCM 114 is formed and connected to two electrical contacts (e.g., vias) 116. At least one resistive heater 118 is formed in close enough proximity to the PCM region 114 to be able to either amorphize or crystalize the PCM region 114; in the illustrated example, two resistive heaters 118 are shown, bracketing the PCM region 114. Not shown are electrical contacts to the resistive heaters 118, which may be coupled to a driver circuit that is controlled to provide different power profiles corresponding to the different thermal profiles required to switch the resistivity states of the PCM region 114.

PCM switches are fast, non-volatile, have a relatively small form factor, and can be readily integrated with CMOS electronics. As such, they have a great potential for implementing high-speed RF switch networks. However, use of PCM switches in RF switch networks is not without drawbacks. In particular, PCM switches may exhibit an appreciable parasitic capacitance that may require added impedance matching circuitry.

Conventionally, all of the PCM switches in an RF switch network are treated as a single large capacitance, and impedance matching (IM) is by means of a T-type IM network to compensate for the whole capacitance to ground in the RF switch network. The T-type IM network is thus an L-C-L' configuration, where C is the capacitance to ground of all of the PCM switches in the RF switch network, and L and L' are bracketing inductances at terminals of the RF switch network. Notably, the larger the capacitance C, the narrower the bandwidth of the RF switch network and the larger the required IM inductances L, L'. Larger IM inductances consume more integrated circuit (IC) die area, and are thus increase cost, while narrower bandwidth limits applications.

Accordingly, there is a need for PCM-based RF switch networks and methods that provide wider bandwidth and smaller IM inductances. The present invention addresses this need.

SUMMARY

The present invention encompasses circuits and methods that provide wider bandwidth and smaller IM inductances for phase change material (PCM) based RF switch networks. More specifically, the present invention recognizes that it is beneficial to consider the total high parasitic capacitance to ground of the various PCM switches in an RF switch network as constituting two or more separate capacitive contributions. This leads to several "split capacitance" concepts, including signal-path splitting, switch-block splitting, stacked-switch splitting, and splitting parasitic capacitances due to layout discontinuities, in which compensating impedance matching inductances are inserted between additive capacitances.

One aspect of the invention encompasses circuits and methods for impedance matching a radio frequency switch network that includes a plurality of branches each including at least one PCM switch, including coupling each branch of the radio frequency switch network to a common terminal through a respective distinct inductor.

Another aspect of the invention encompasses circuits and methods for impedance matching a radio frequency switch network that includes a plurality of branches each including at least one PCM switch, including, for each branch, coupling a first inductor to a corresponding branch signal terminal, coupling a series PCM switch between the corresponding signal terminal of the branch and a common terminal of the radio frequency switch network, and coupling a first port of a shunt PCM switch between the first inductor and the corresponding signal terminal of the branch.

Yet another aspect of the invention encompasses circuits and methods for impedance matching a radio frequency switch network that includes a plurality of branches each including at least one series PCM switch, including stacking two or more PCM switch components in series between first and second ports of at least one of the at least one series PCM switch, and coupling at least one inductor in series between a pair of adjacent PCM switch components.

The details of one or more embodiments of the invention are set forth in the accompanying drawings and the description below. Other features, objects, and advantages of the invention will be apparent from the description and drawings, and from the claims.

DESCRIPTION OF THE DRAWINGS

Like reference numbers and designations in the various drawings indicate like elements.

DETAILED DESCRIPTION

The present invention encompasses circuits and methods that provide wider bandwidth and smaller IM inductances for PCM-based switch circuits. More specifically, the present invention recognizes that it is beneficial to consider the total high parasitic capacitance to ground of the various PCM switches in an RF switch network as constituting two or more separate capacitive contributions. This leads to several "split capacitance" concepts, including signal-path splitting, switch-block splitting, stacked-switch splitting, and splitting parasitic capacitances due to layout discontinuities, in which compensating impedance matching inductances are inserted between additive capacitances.

Capacitive Coupling in PCM Switches

Referring back to FIG. 1B, as suggested by the proximity of the resistive heaters 118 to the PCM region 114 in a PCM switch 110, the PCM region 114 and the resistive heaters 118 form a parasitic capacitor structure. When the resistive heaters 118 are grounded or AC grounded (i.e., grounded at a frequency of interest), parasitic capacitance also exists between the PCM region 114 and ground. The parasitic capacitance can lead to an unusual situation where there is more capacitance in the ON-state compared to the OFF-state of a PCM switch 110.

Figure 1A:
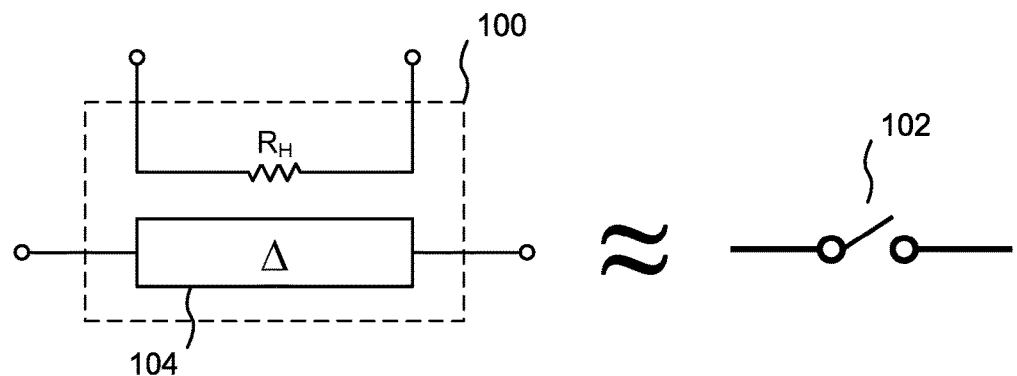
FIG. 1A is a diagram of a prior art electrical symbol for a PCM switch, and an equivalent single-pole, single-throw switch symbol.
Figure 1B:
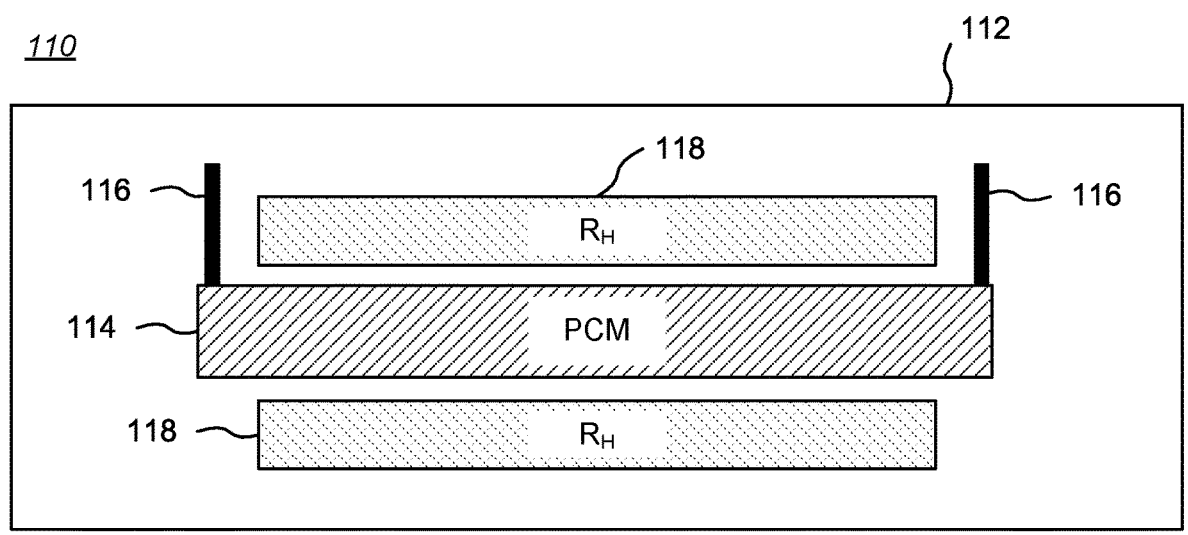
FIG. 1B is a stylized cross-sectional view of a portion of an IC showing the physical structure of a PCM switch.

To better understand the consequences of capacitive coupling between the PCM region 114 and the resistive heaters 118, it is useful to consider the materials and electrical characteristics of a PCM switch 110 in detail. The PCM region 114 may be made of a chalcogenide alloy; examples include germanium-antimony-tellurium (GST), germanium-tellurium, and germanium-antimony. The resistive heaters 118 (referred to in the plural here, but may be implemented as a single heating element, as suggested by FIG. 1A) may be made of a metal (e.g., copper, aluminum, nickel-chromium, or tungsten) or of any other material compatible with IC fabrication and which heats when subjected to electrical power. A resistive heater 118 in proximity to the PCM region 114 forms two plates of a capacitor. Capacitive coupling is compounded when multiple resistive heaters 118 are used, as shown in FIG. 1B.

Figure 2A:
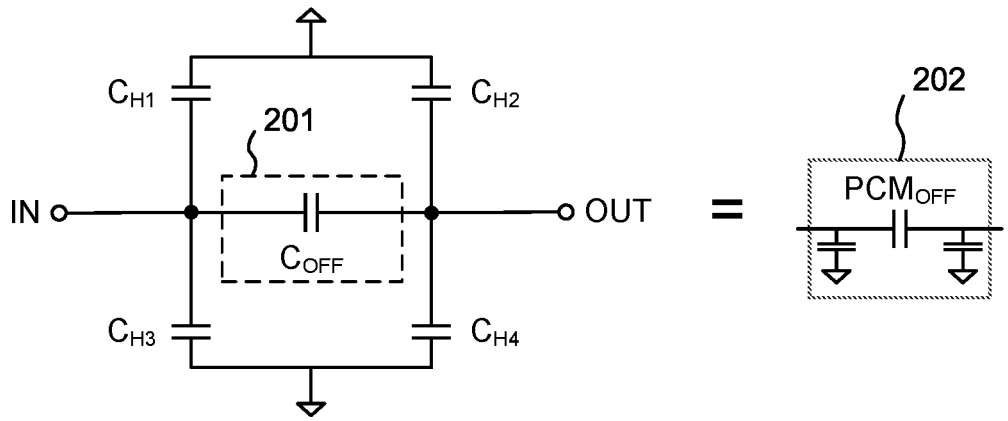
FIG. 2A is a schematic diagram of a modeled equivalent circuit for a PCM switch in an OFF state.

FIG. 2A is a schematic diagram of a modeled equivalent circuit 200 for a PCM switch in an OFF state. The OFF-state (amorphous) PCM region 114 of the PCM switch 200 is modeled as a capacitance $C_{OFF}$ between IN and OUT terminals, while the parasitic coupled capacitance of a pair of resistive heaters 118 is shown as capacitances $C_{H1}$–$C_{H4}$ coupled to $C_{OFF}$ as shown. Capacitances $C_{H1}$–$C_{H4}$ may be AC grounded (i.e., grounded at a frequency of interest) but may be differentially driven. In general, $C_{OFF}$ is smaller than the capacitances $C_{H1}$–$C_{H4}$. For example, in the illustrated model, $C_{OFF}$ may be about 1.8 fF and capacitances $C_{H1}$–$C_{H4}$ may each be about 4 fF. An OFF-state PCM switch may be represented by a two-port symbol 202 indicating the $C_{OFF}$ capacitance in the center and bracketing parasitic shunt capacitors to circuit ground ($C_{H1}$+$C_{H3}$ on the left side and $C_{H1}$+$C_{H4}$ on the right side in this example).

Figure 2B:
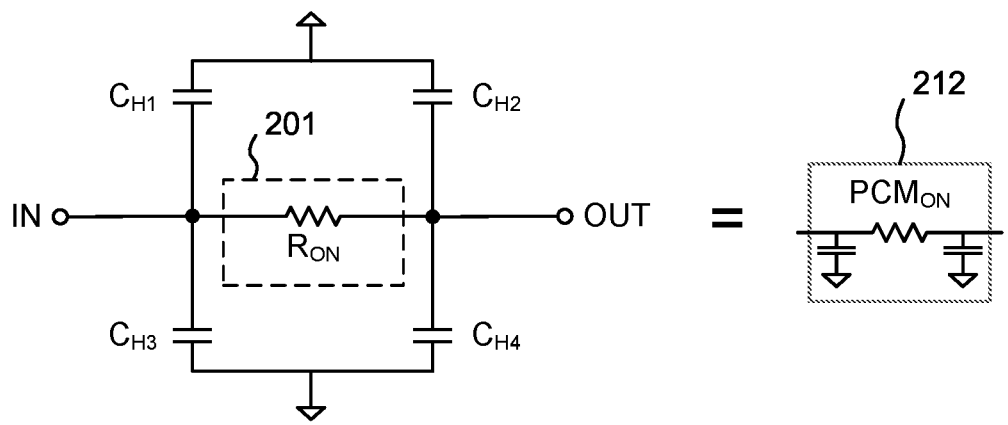
FIG. 2B is a schematic diagram of a modeled equivalent circuit for a PCM switch in an OFF state.

FIG. 2B is a schematic diagram of a modeled equivalent circuit 210 for a PCM switch in an ON state. In the ON state, the capacitance $C_{OFF}$ of the PCM region 114 would be replaced in the modeled equivalent circuit 210 by a resistance $R_{ON}$, which may be about 1-3 ohms. An ON-state PCM switch may be represented by a two-port symbol 212 indicating the RUN resistance in the center and bracketing parasitic shunt capacitors to circuit ground (again, $C_{H1}+C_{H3}$ on the left side and $C_{H1}+C_{H4}$ on the right side in this example). Of note, in both the OFF and ON states, the parasitic coupled capacitances $C_{H1}$–$C_{H4}$ are always present, coupled between the IN and OUT terminals of the PCM switch.

Omitted from the illustrated example as conventional elements are driver and control circuitry that would be coupled to the resistive heaters 118. As is known, a control circuit coupled to the driver circuit would provide precise amounts of electrical power through the resistive heaters 118 for precise periods of time to generate thermal profiles that control phase state changes of the PCM region 114. To control each resistive heater 118, one of the heater terminals may be AC grounded and used to apply a programming (state change) pulse through the driver circuit, while the other terminal is simply grounded. Alternatively, the resistive heater 118 may be differentially driven with both terminals AC grounded. AC grounding is generally good practice to avoid a spurious resonance path from the PCM region 114 via the resistive heater 118, which could be detrimental to PCM switch performance.

RF Switch Networks Based on PCM Switches

Figure 3:
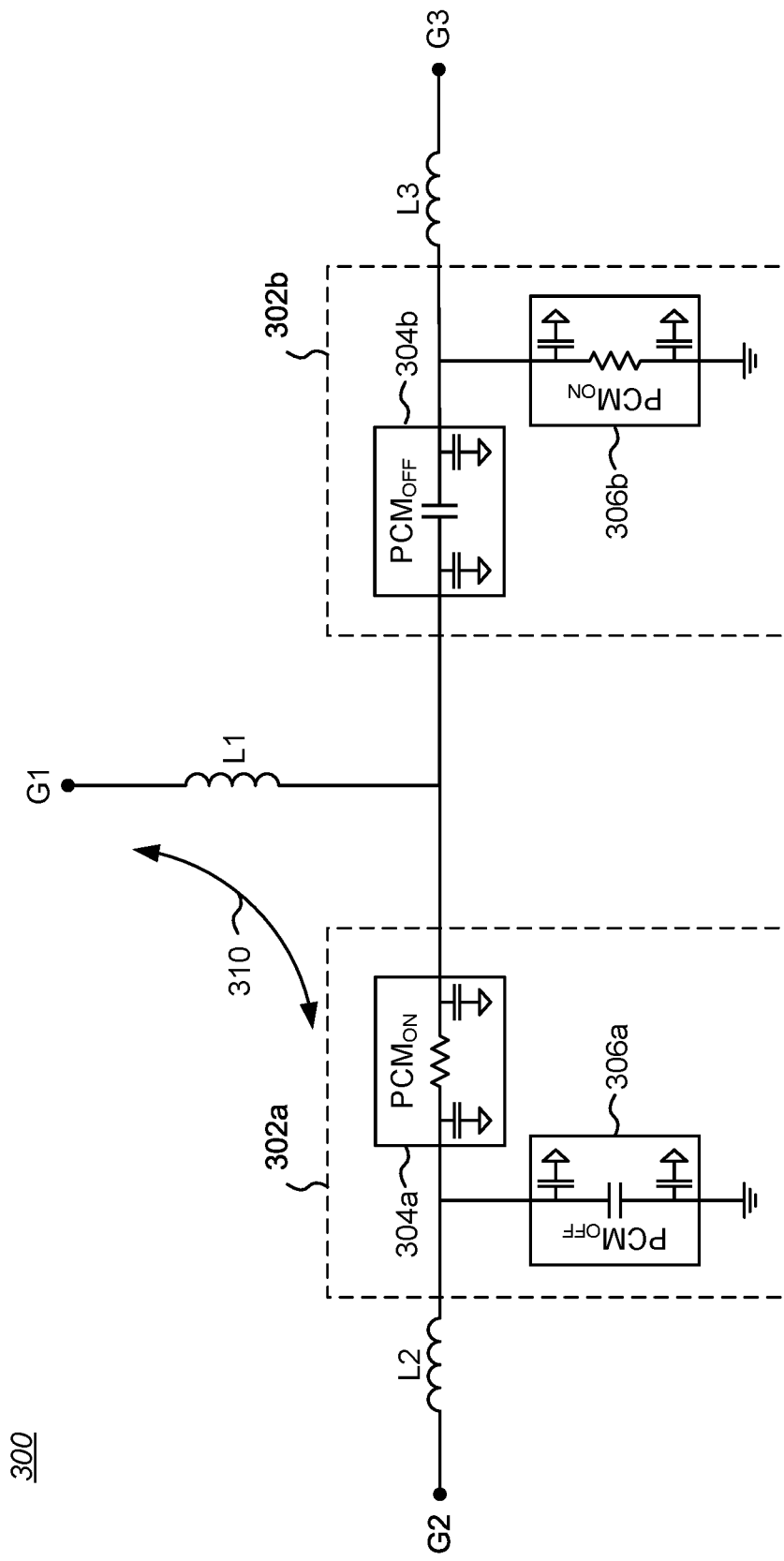
FIG. 3 is a block diagram of a prior art RF switch network based on PCM switches.

FIG. 3 is a block diagram of a prior art RF switch network 300 based on PCM switches. In the illustrated example, a first signal path or branch from common terminal G1 to signal terminal G2 includes an IM inductor L1, a series-shunt switch block 302a, and an IM inductor L2. A second signal path or branch from common terminal G1 to signal terminal G3 includes the IM inductor L1, a series-shunt switch block 302b, and an IM inductor L3. Accordingly, the example RF switch network 300 may be operated as a single-pole, double-throw (SPDT) switch.

The series-shunt switch blocks 302a, 302b each include a series PCM switch 304a, 304b having its ports coupled in series with a signal-carrying path that includes other components (e.g., IM inductors L1 and L2 in FIG. 3). The series-shunt switch blocks 302a, 302b also each include a shunt PCM switch 306a, 306b having its ports coupled to the signal-carrying path and to a reference voltage (e.g., circuit ground) and functioning as a selective isolation path. In an ON-state series-shunt switch block, the series PCM switch 304a, 304b is CLOSED (conductive) and the shunt PCM switch 306a, 306b is OPEN (non-conductive). Conversely, in an OFF-state series-shunt switch block, the series PCM switch 304a, 304b is OPEN and the shunt PCM switch 306a, 306b is CLOSED.

In the example shown in FIG. 3, the left-side series-shunt switch block 302a is in an ON-state, and accordingly an applied signal may flow between terminals G1 and G2 (i.e., the "ON-path"), as indicated by arrow 310. The right-side series-shunt switch block 302b is in an OFF-state, and accordingly signal flow is blocked between terminals G1 and G3 (i.e., the "OFF-path"). Further, since series-shunt switch block 302b is in an OFF-state, terminal G3 is isolated from the ON-path by being coupled to signal ground through the corresponding ON-state shunt PCM switch 306b. In the illustrated configuration, the OFF-path contributes a not insubstantial parasitic capacitance to the ON-path, whose own parasitic capacitance may be substantial. For example, using the values $C_H$ (assuming $C_H=C_{H1}=C_{H2}=C_{H3}=C_{H4}$) and $C_{OFF}$ from the models shown in FIGS. 2A and 2B, the parasitic capacitance to ground in the left-side series-shunt switch block 302a ON-path is $6.5*C_H$, while the parasitic capacitance to ground in the right-side series-shunt switch block 302b OFF-path is $\sim 2*C_H+C_{OFF}$, or about $2.5*C_H$ total. Note that in practical circuits, there are many capacitance-to-ground contributors, including connector traces and metallization layers.

As noted above, conventionally, all of the PCM switches and other parasitic capacitance contributors in an RF switch network are treated as a single large capacitance, and impedance matching (IM) is by means of a T-type IM network to compensate for the whole capacitance to ground in the RF switch network. With respect to FIG. 3, the T-type IM network is thus an "L-C-L" configuration, where the first L is IM inductor L1, C is the effective additive capacitance to ground of all of the series-shunt switch blocks 302a, 302b in the RF switch network, and the second L is IM inductor L2. This conventional approach generally results in large inductance values for L1 and L2, an undesirable outcome.

Split-Capacitance Concept

The present invention encompasses circuits and methods that recognize that it is beneficial to consider the total high parasitic capacitance to ground of the various PCM switches in an RF switch network as constituting two or more separate capacitive contributions. This leads to several "split capacitance" concepts.

A first concept is signal-path splitting, where an RF switch network may be considered to have an ON-path capacitance $C_{PCM\_ON}$ that includes the total capacitance (including parasitic capacitance) of an ON-state series-shunt switch block (e.g., series-shunt switch block 302a), and an OFF-path capacitance $C_{PCM\_OFF}$ that includes the total capacitance (including parasitic capacitance) of all OFF-state series-shunt switch blocks (e.g., series-shunt switch block 302b and any similar OFF-state series-shunt switch blocks).

An IM network—and especially a ladder-type IM network—may be implemented that takes advantage of "splitting" the total parasitic capacitance of an RF switch network into distinct signal path capacitive contributions having smaller values. Splitting ON-path and OFF-path capacitive contributions allows use of an "L-C-L-C" IM network configuration in which the first "C" is only $C_{PCM\_ON}$ (and thus does not include the additive $C_{PCM\_OFF}$ component) and the second "C" is the net capacitance of the entire OFF branch, which in this case is a series arrangement of matching inductance with $C_{PCM\_OFF}$ (as will be described in reference to FIG. 4 below), leading to smaller inductance values for the IM network. The smaller inductance values for the IM network result in a lower Q and a wider bandwidth for the RF switch network compared to a conventional design.

A second concept is switch-block splitting, where the capacitance to ground of the series PCM switches 304a, 304b and the shunt PCM switches 306a, 306b within series-shunt switch blocks 302a, 302b may be split by introducing an intervening inductor, so as to enable a "C-L-C" IM network configuration, saving an inductor compared to an "L-C-L-C" IM network configuration. Further, for the same value of C, an "L-C-L" T-type matching network will use smaller values of L's for matching compared with a "C-L-C" Pi-type matching network. One or two inductors may be added to create a "C-L-C-L", "L-C-L-C", or "L-C-L-C-L" IM network configuration, all of which result in a lower Q and a wider bandwidth for the RF switch network compared to a conventional design.

These two concepts—signal-path splitting and switch-block splitting—may be combined as a "C-L-C-L-C", "L-C-L-C-L-C", "C-L-C-L-C-L", or an "L-C-L-C-L-C-L" IM network configuration to provide an even lower Q and greater increase in the bandwidth of an RF switch network. Beneficially splitting additive capacitances means smaller C's in an IM network, which leads to smaller L's. The smaller the L's and C's, the smaller the deviation from the characteristic impedance for the circuit (typically 50 Ohms in the RF field), the lower the Q, and the larger the bandwidth.

A third concept is stacked-switch splitting (i.e., splitting capacitances inside a stack of switches), in which an inductor may be inserted between internal PCM switch components of the series PCM switch of a series-shunt switch block. This concept may be combined with either or both of the signal-path splitting and switch-block splitting concepts, as detailed below.

A fourth concept is to consider discontinuities in the layout of a practical circuit (e.g., PCM and RF discontinuities such as T-junctions) as reactive networks with capacitances to ground. Of note, the capacitances to ground due to such discontinuities are not small. To compensate for the additional parasitic capacitances C caused by such layout discontinuities, IM inductors L may then be inserted between those parasitic capacitances, thus "splitting" those capacitances.

Signal Path Split-Capacitance IM Network Configuration Example

Figure 4:
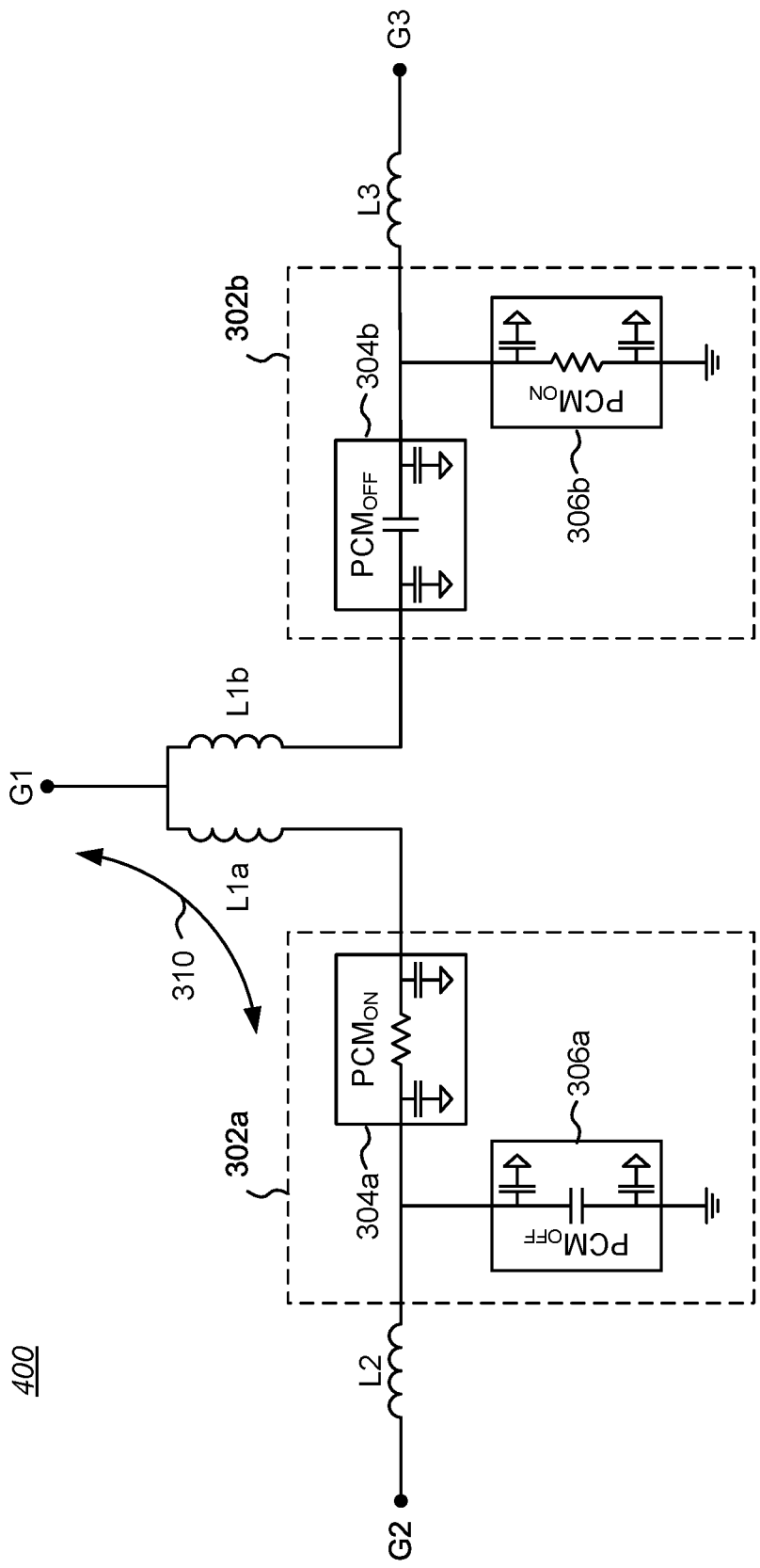
FIG. 4 is a block diagram of a first embodiment of a split-capacitance RF switch network based on PCM switches.

FIG. 4 is a block diagram of a first embodiment of a split-capacitance RF switch network 400 based on PCM switches. In the illustrated example, an ON-path from terminal G1 to terminal G2 includes an IM inductor L1a, a series-shunt switch block 302a in an ON-state, and an IM inductor L2. An OFF-path from terminal G1 to terminal G3 includes an IM inductor L1b, a series-shunt switch block 302b in an OFF-state, and an IM inductor L3.

Comparing FIG. 4 to FIG. 3, the single IM inductor L1 coupled to terminal G1 in FIG. 3 has been split into two IM inductors, L1a and L1b, corresponding to separate first and second signal paths to terminals G2 and G3, respectively. FIG. 4 is thus one example of signal path splitting to define separate capacitive contributions for the RF switch network 400. Notably, by splitting the signal path, the IM inductors L1a and L1b are smaller, which leads to smaller C's in the IM network with the attendant benefits noted above. Thus, a T-type IM circuit for the ON-path would include IM inductor L1a, the ON-path capacitance $C_{PCM\_ON}$, IM inductor L2, and the smaller contribution from the entire net OFF-path capacitance, which in this case is a series arrangement of matching inductance with $C_{PCM\_OFF}$ in an "L-C-L-C" IM network configuration. While two IM inductors L1a and L1b are needed for this example embodiment, their total size is smaller than the single, larger IM inductor L1 in FIG. 3 because the respective capacitance that must be matched by each IM inductor L1a, L1b is less in the circuit configuration of FIG. 4. The smaller inductance values for the IM network results in a lower Q and a wider bandwidth for the RF switch network compared to a conventional design.

As one example of the benefits of signal-path splitting, the prior art approach shown in FIG. 3 required designing an L-C-L IM network to compensate for a capacitance of $9*C_H$ ($6.5*C_H$ for the series-shunt switch block 302a ON-path plus about $2.5*C_H$ for the series-shunt switch block 302b OFF-path). By signal-path splitting as shown in FIG. 4, the $9*C_H$ value is separated into 2 capacitances that are 72% ($6.5*C_H$) and 28% ($2.5*C_H$) of the sum, enabling use of an L-C-L-C IM network with smaller inductance values, and thus closer adherence to a 50 Ohm characteristic impedance, a lower Q, and a larger bandwidth.

Switch Block Split-Capacitance IM Network Configuration Example

Figure 5:
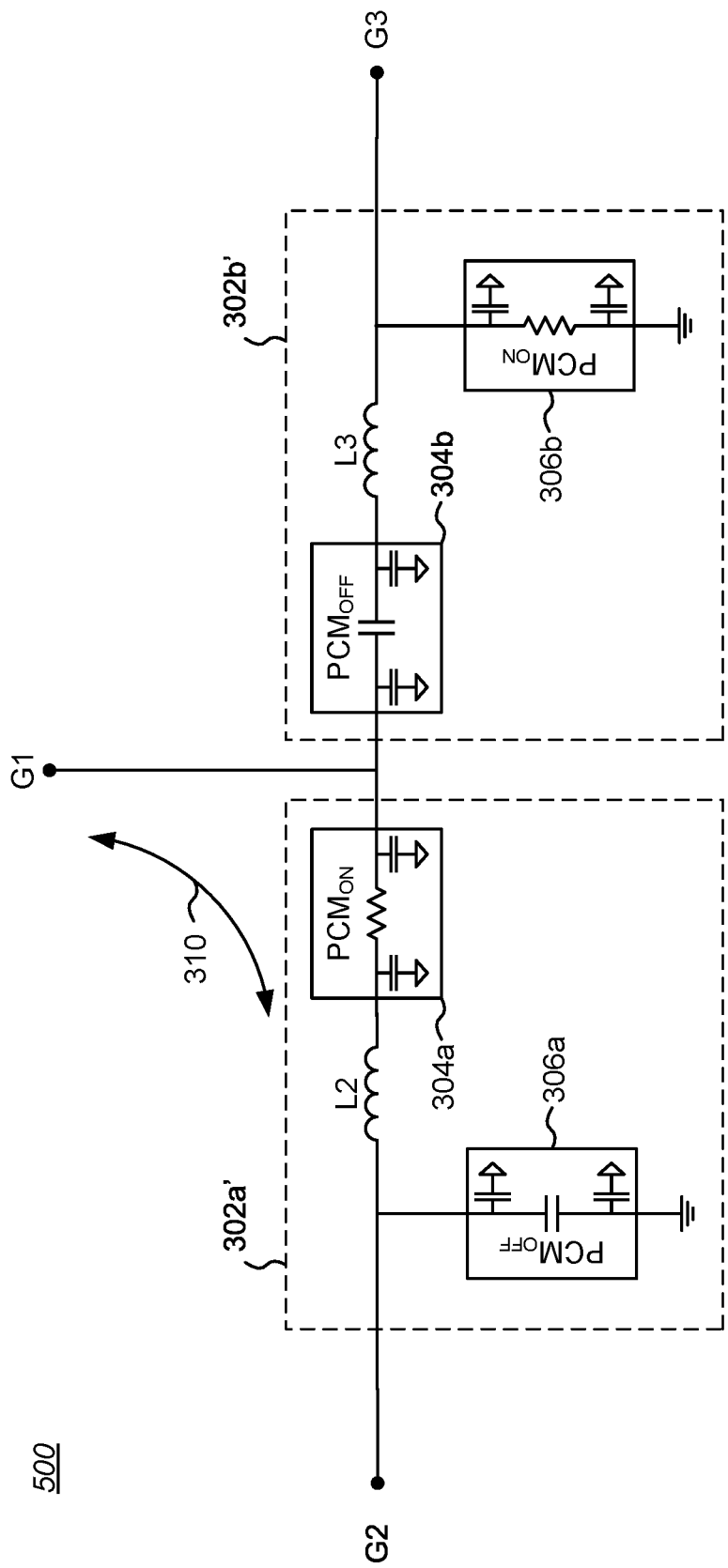
FIG. 5 is a block diagram of a second embodiment of a split-capacitance RF switch network based on PCM switches.

FIG. 5 is a block diagram of a second embodiment of a split-capacitance RF switch network 500 based on PCM switches. The RF switch network 500 includes modified series-shunt switch blocks 302a', 302b' each comprising a series PCM switch 304a, 304b separated (split) from a shunt PCM switch 306a, 306b by an IM inductor L2, L3. In the illustrated example, an ON-path from terminal G1 to terminal G2 includes a series PCM switch 304a in an ON-state, an IM inductor L2, and a shunt PCM switch 306a in an OFF state. An OFF-path from terminal G1 to terminal G3 includes a series PCM switch 304b in an OFF-state, an IM inductor L3, and a shunt PCM switch 306b in an ON-state.

Comparing FIG. 5 to FIG. 3, the single IM inductor L1 coupled to terminal G1 in FIG. 3 has been omitted (thus saving a component and IC die space), and the respective PCM switch components 304a, 304b and 306a, 306b of the modified series-shunt switch blocks 302a', 302b' have been "split" by a respective intervening IM inductor L2, L3.

By moving the IM inductors L2, L3 from "outside" the unmodified series-shunt switch blocks 302a, 302b of FIG. 3 to "inside" the modified series-shunt switch blocks 302a', 302b' as shown in FIG. 5, the electrical interaction of the series PCM switches 304a, 304b with respect to the corresponding shunt PCM switches 306a, 306b is altered by the intervening inductor. That is, the intervening inductor effectively splits the total capacitance of a modified series-shunt switch block 302a', 302b' into two parts: the capacitance on a first side of the intervening inductor and the capacitance on a second side of the intervening inductor.

By splitting the series-shunt switch block capacitive contributions, a "C-L-C" Pi-type IM network configuration may be used for each signal path. For example, for the ON-path in FIG. 5, the IM network configuration comprises the capacitance of the ON-path shunt PCM switch 306a, IM inductor L2, and the capacitance of the remaining portion of the RF switch network (i.e., the capacitance of the ON-path series PCM switch 304a and of the entire OFF-path). As noted above, this "C-L-C" IM network configuration saves an inductor compared to an L-C-L IM network configuration.

An inductor L may be added to the embodiment shown in FIG. 5 between the G2 terminal and the modified series-shunt switch block 302a' to create an IM network having an "L-C-L-C" configuration, which lowers the Q and increase the bandwidth of an RF switch network compared to the embodiment shown in FIG. 5. An inductor L may be added to the embodiment shown in FIG. 5 between the modified series-shunt switch block 302a' and the G1 terminal to create an IM network having a "C-L-C-L-C" configuration (e.g., with the rightmost C being the capacitance of the entire OFF-path), which not only lowers the Q and improves the bandwidth by having an extra matching section, but also splits the paths.

Figure 6:
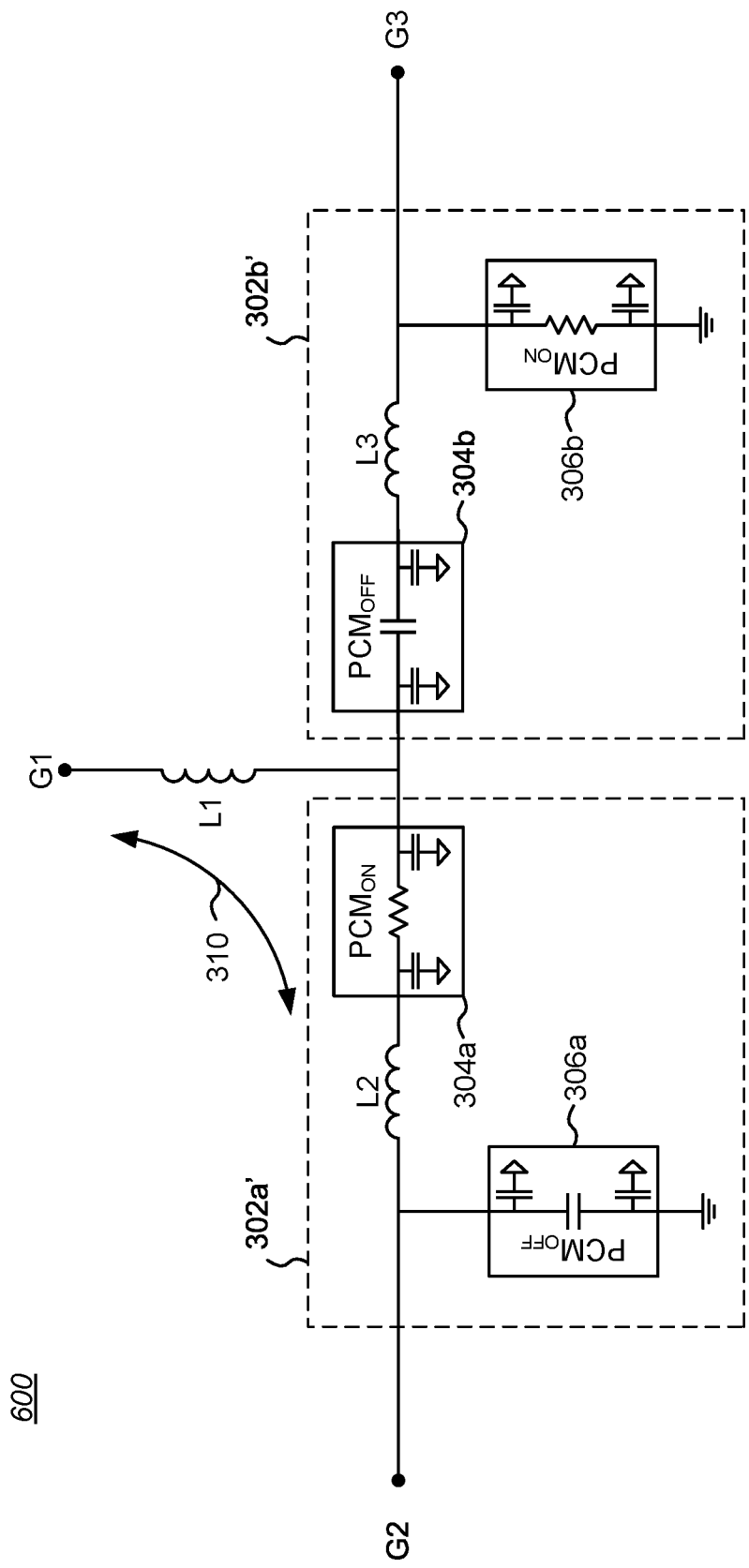
FIG. 6 is a block diagram of a third embodiment of a split-capacitance RF switch network based on PCM switches.

For example, FIG. 6 is a block diagram of a third embodiment of a split-capacitance RF switch network 600 based on PCM switches. The illustrated circuit is similar to the embodiment of FIG. 5 but adds an IM inductor L1 between the signal branches and terminal G1. For the ON-path, the IM network configuration comprises a "C-L-C-L" arrangement: the capacitance of the ON-path shunt PCM switch 306a, IM inductor L2, the capacitance of the remaining portion of the RF switch network (i.e., the capacitance of the ON-path series PCM switch 304a and of the entire OFF-path), and IM inductor L1.

Figure 7:
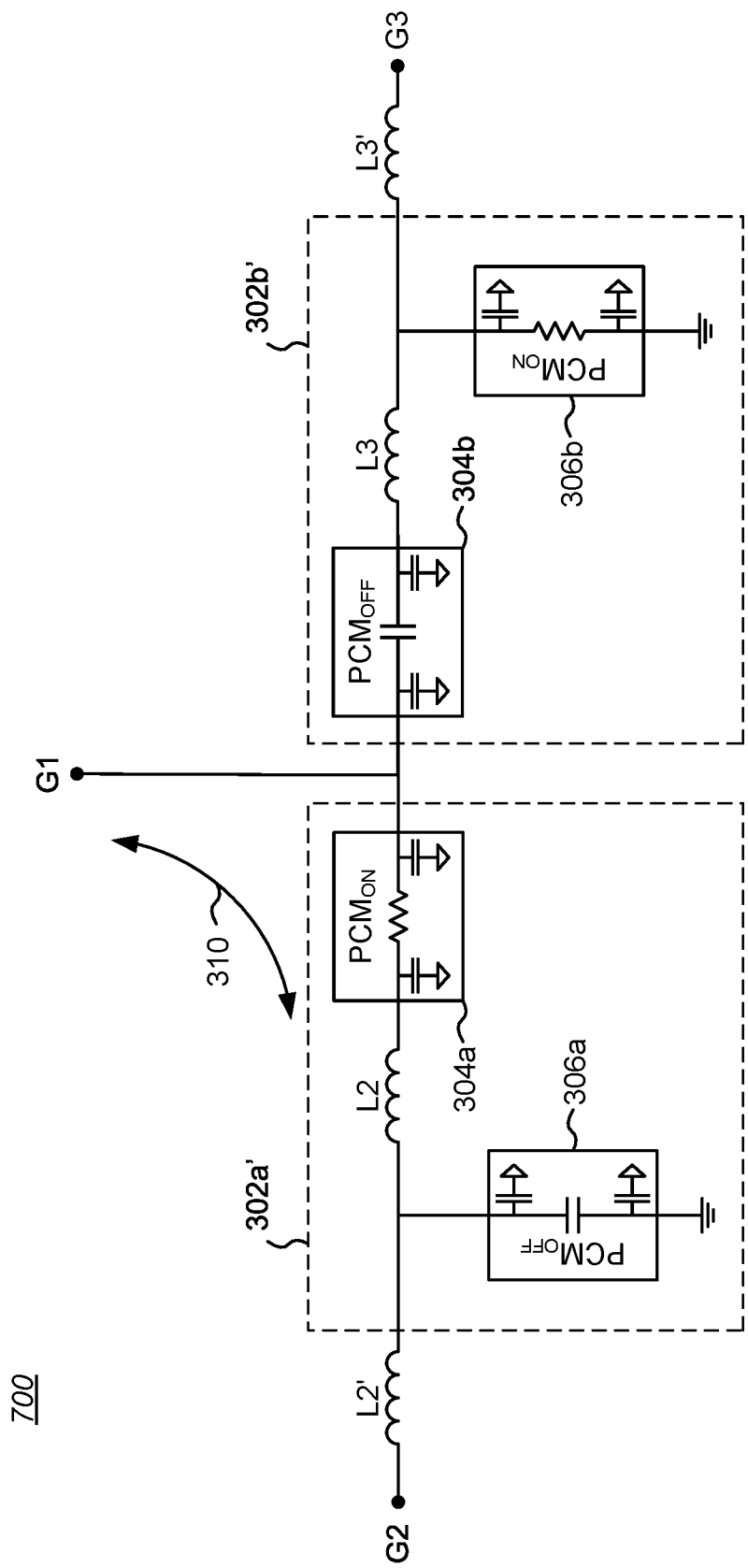
FIG. 7 is a block diagram of a fourth embodiment of a split-capacitance RF switch network based on PCM switches.

As another example, FIG. 7 is a block diagram of a fourth embodiment of a split-capacitance RF switch network 700 based on PCM switches. The illustrated circuit is similar to the embodiment of FIG. 5 but adds IM inductors L2' and L3' between the modified series-shunt switch blocks 302a', 302b' and their respective terminals G2 and G3. For the ON-path, the IM network configuration comprises an "L-C-L-C" arrangement: IM inductor L2', the capacitance of the ON-path shunt PCM switch 306a, IM inductor L2, and the capacitance of the remaining portion of the RF switch network (i.e., the capacitance of the ON-path series PCM switch 304a and of the entire OFF-path).

If desired, the embodiments of FIGS. 6 and 7 may be combined. For example, starting with the embodiment of FIG. 7, an IM inductor L1 may be added between the signal branches and terminal G1, as in the embodiment of FIG. 6. The result is an "L-C-L-C-L" configuration, with the rightmost C being the contributions of the series PCM switch 304a and the modified series-shunt switch block 302b'.

Combination Embodiments

Signal path splitting and switch block splitting may be combined to provide an IM network configuration for an RF switch network that results in an even lower Q and greater increase in the bandwidth than the embodiments of FIGS. 4-7.

Figure 8:
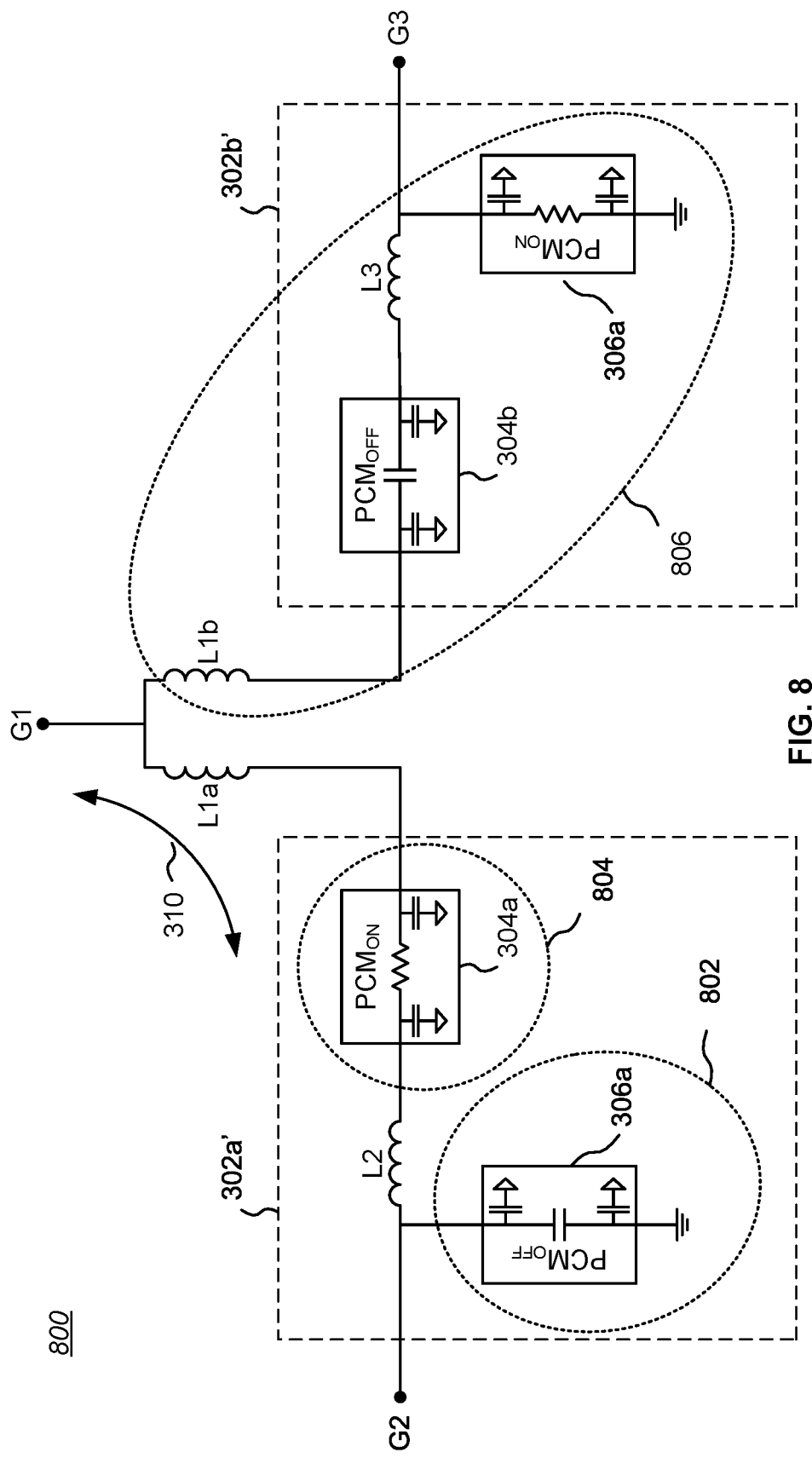
FIG. 8 is a block diagram of a fifth embodiment of a split-capacitance RF switch network based on PCM switches.

For example, FIG. 8 is a block diagram of a fifth embodiment of a split-capacitance RF switch network 800 based on PCM switches. In the illustrated example, an ON-path from terminal G1 to terminal G2 includes an IM inductor L1a, a series PCM switch 304a in an ON-state, an IM inductor L2, and a shunt PCM switch 306a. An OFF-path from terminal G1 to terminal G3 includes an IM inductor L1b, a series PCM switch 304b in an OFF-state, an IM inductor L3, and a shunt PCM switch 306b.

For the ON-path, the IM network configuration comprises a "C-L-C-L-C" arrangement: the capacitance of the ON-path shunt PCM switch 306a, IM inductor L2, the capacitance of the series PCM switch 304a, IM inductor L1a, and the capacitance of the remaining portion of the RF switch network (i.e., the net capacitance of the OFF-branch).

By combining signal path splitting and switch block splitting, three capacitance contributions are separated, as shown by dotted ovals in FIG. 8: the capacitance of an ON-path shunt PCM switch (dotted oval 802), the capacitance of an ON-path series PCM switch (dotted oval 804), and the net capacitance of an OFF-path (dotted oval 806, encompassing IM inductor L1b in series with the modified series-shunt switch block 302b', which is capacitive for frequencies less than the resonance frequency; the switch operational point is below the resonance, where a series LC arrangement behaves as a capacitance). The resulting 5-element "C-L-C-L-C" is a lower Q and even wider bandwidth compared to the embodiments of FIGS. 4-7 (as wells as compared to conventional designs).

Figure 9:
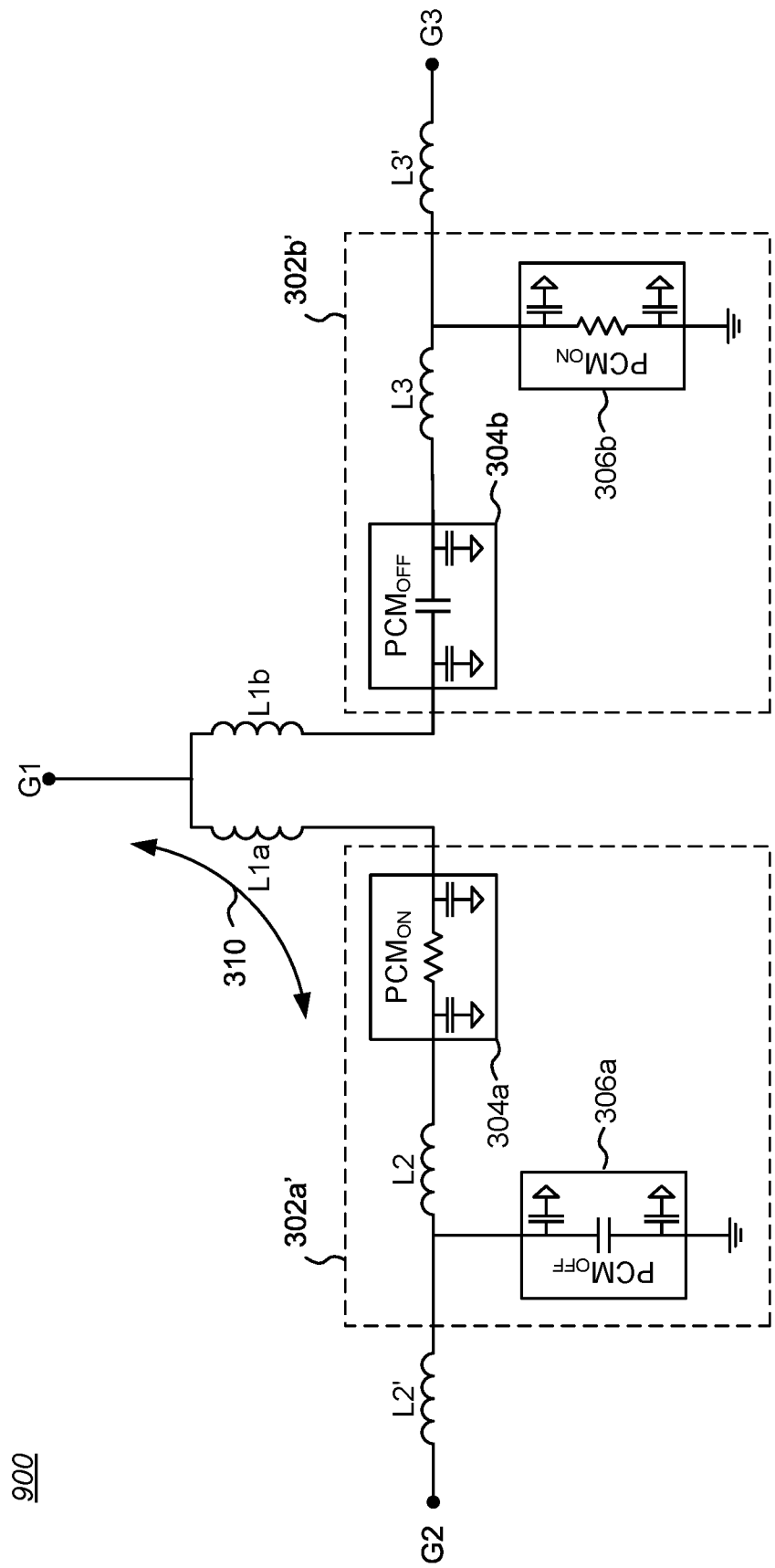
FIG. 9 is a block diagram of a sixth embodiment of a split-capacitance RF switch network based on PCM switches.

Another inductor may be added to the embodiment shown in FIG. 8 to create a 6-element "L-C-L-C-L-C" IM network configuration, with an even lower Q and increased the bandwidth of an RF switch network compared to the embodiment shown in FIG. 8. For example, FIG. 9 is a block diagram of a sixth embodiment of a split-capacitance RF switch network 900 based on PCM switches. The illustrated circuit is similar to the embodiment of FIG. 8 but adds IM inductors L2' and L3' between the modified series-shunt switch blocks 302a', 302b' and their respective terminals G2 and G3. Accordingly, for the ON-path, the IM network configuration comprises 6 elements: IM inductor L2', the capacitance of the ON-path shunt PCM switch 306a, IM inductor L2, the capacitance of the series PCM switch 304a, IM inductor L1a, and the capacitance of the remaining portion of the RF switch network (i.e., the net capacitance of the OFF-branch). In alternative embodiments, a 6-element "C-L-C-L-C-L" or a 7-element "L-C-L-C-L-C-L" IM network configuration can be created using the inventive splitting concepts.

Stacked PCM Switches

Figure 10:
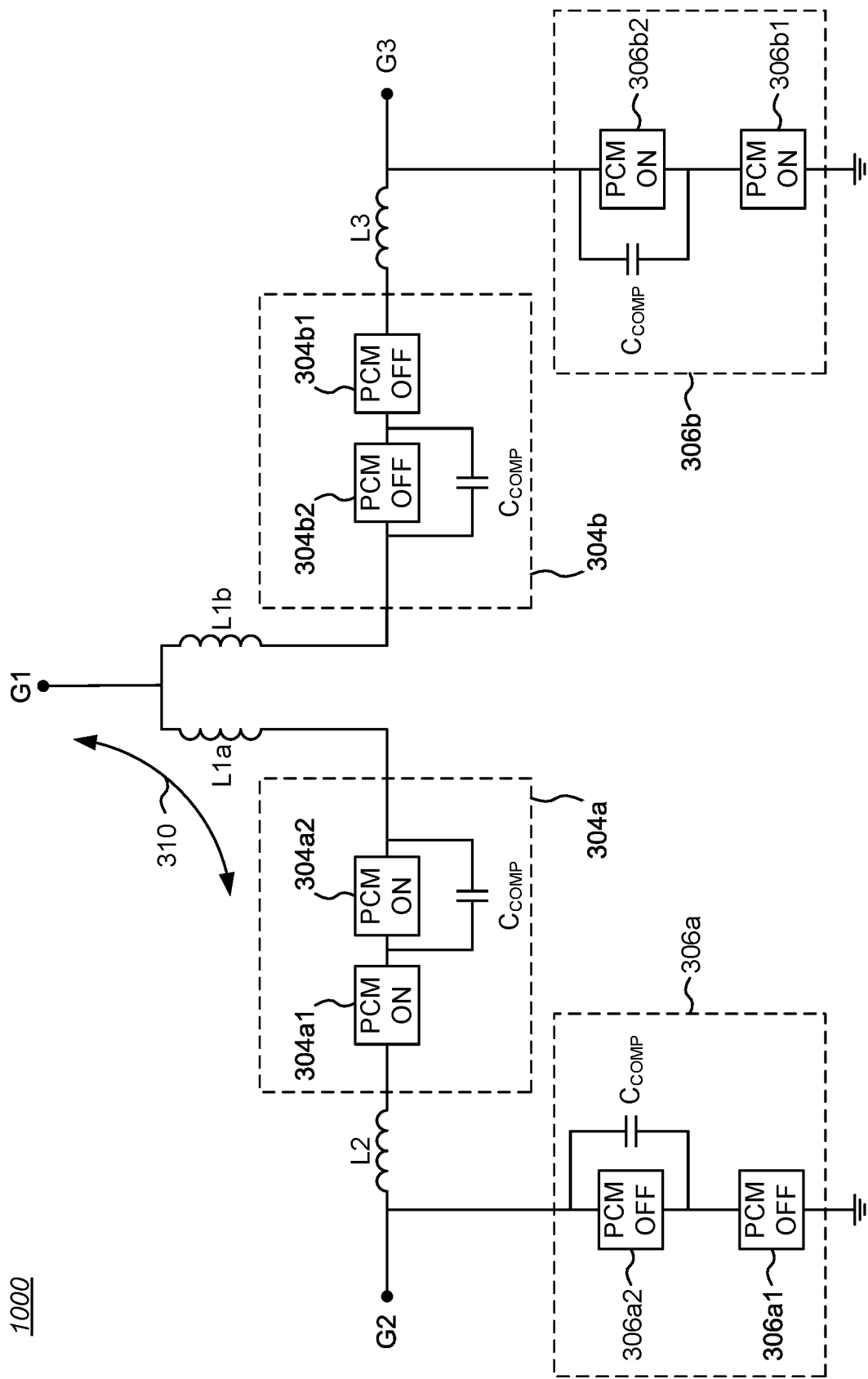
FIG. 10 is a block diagram of a first embodiment of a split-capacitance RF switch network based on stacked PCM switches.

In some applications, it may be useful to "stack" PCM switches—connecting them end-to-end in series—in order to withstand higher applied voltages by voltage division over the stack. For example, FIG. 10 is a block diagram of a first embodiment of a split-capacitance RF switch network 1000 based on stacked PCM switches. The illustrated circuit is similar in general to the embodiment of FIG. 8, but each series PCM switch 304a, 304b and each shunt series PCM switch 306a, 306b comprises a stack of two series-connected PCM switch components. In some applications, more than two PCM switch components may be stacked within each series PCM switch 304a, 304b and shunt series PCM switch 306a, 306b. The state of the stacked PCM switch components may be set by a common control signal (not shown) such that each PCM switch 304a, 304b, 306a, 306b operates as a single ON/OFF switch. In the illustrated example, a compensation capacitor $C_{COMP}$ is coupled in parallel with the PCM switch component farthest from ground to even out the voltages across the series capacitances of the PCM switch components. The voltages are uneven due to shunt capacitance (parasitic capacitance to ground) between the PCM switch components inside a stack. Balance for a stack-of-two PCM switch components can be restored using a compensation capacitor $C_{COMP}$ as shown in FIG. 10. If the stack size is greater than two, all the PCM switch components except the one closest to ground should be provided with a respective compensation capacitor.

In the illustrated embodiment, the series PCM switch 304a in the ON-path comprises a stack of two series-coupled PCM switch components 304a1 and 304a2, both in the ON state. Similarly, the shunt PCM switch 306a in the ON-path comprises a stack of two series-coupled PCM switch components 306a1 and 306a2, both in the OFF state. The series PCM switch 304b and shunt PCM switch 306b in the OFF path are similarly stacked. The stacked series PCM switch 304a and the stacked shunt PCM switch 306a, along with IM inductor L2, comprise a modified series-shunt switch block (comparable to the modified series-shunt switch block 302a' of FIG. 8). Similarly, the stacked series PCM switch 304b and the stacked shunt PCM switch 306b, along with IM inductor L3, comprise a modified series-shunt switch block (comparable to the modified series-shunt switch block 302b' of FIG. 8).

For the ON-path, the IM network configuration for the embodiment of FIG. 10 may be a "C-L-C-L-C" arrangement, as in FIG. 8, taking into account the difference in capacitance of a series PCM switch or shunt PCM switch that has a single internal PCM switch component versus multiple stacked internal PCM switch components.

As should be clear, stacked PCM switches may be used with other RF switch network configurations taught by this disclosure, including the configurations shown in FIGS. 4-9.

Split-Capacitance Stacked PCM Switches

Applications that use stacked PCM switch components within a series-shunt switch block 302a, 302b or modified series-shunt switch block 302a', 302b' provide an opportunity for even further capacitance splitting. Thus, a third concept is stacked-switch splitting (i.e., splitting inside a stack), in which an inductor may be inserted between internal PCM switch components of the series PCM switch of a series-shunt switch block 302a, 302b or modified series-shunt switch block 302a', 302b'. This concept applies to the embodiments shown in FIGS. 4-10.

Figure 11:
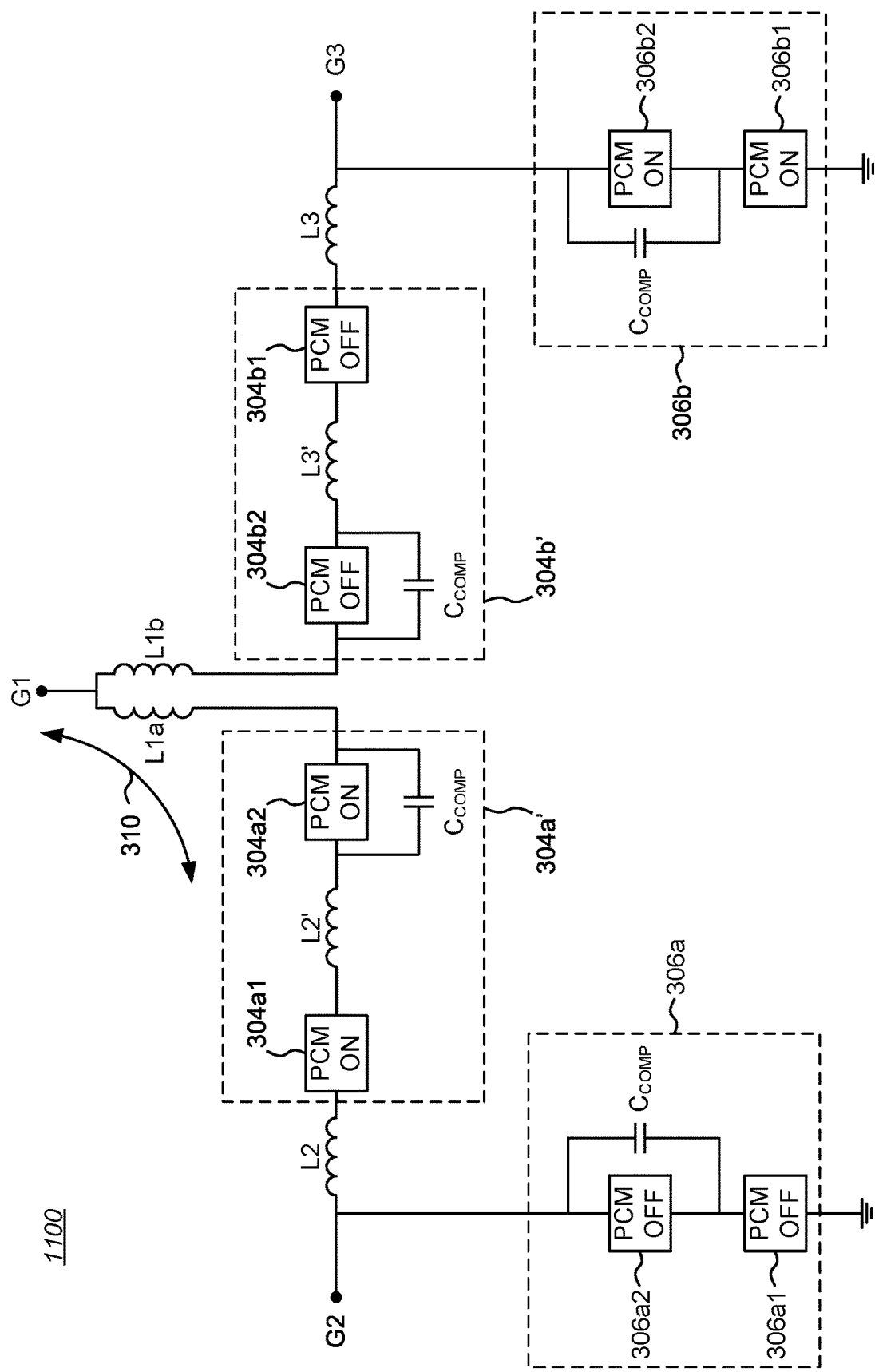
FIG. 11 is a block diagram of a second embodiment of a split-capacitance RF switch network based on stacked PCM switches.

For example, FIG. 11 is a block diagram of a second embodiment of a split-capacitance RF switch network 1100 based on stacked PCM switches. The illustrated embodiment is similar in most respects to FIG. 10, except that the stacked series PCM switches 304a, 304b of FIG. 10 have been replaced by modified stacked series PCM switches 304a', 304b'. In the illustrated example, the modified stacked series PCM switch 304a' includes an intermediate IM inductor L2' between adjacent pairs of PCM switch components 304a1 and 304a2. Similarly, the illustrated modified stacked series PCM switch 304b' includes an intermediate IM inductor L3' between adjacent PCM switch components 304b1 and 304a2. Note that the stacked shunt PCM switches 306a, 306b do not need intermediate inductors between PCM switch components.

If a modified stacked series PCM switch includes more than two PCM switch components, an intermediate inductor may be placed between two or more adjacent pairs of PCM switch components. Thus, for N PCM switch components within a modified stacked series PCM switch, there may be as many as N−1 intermediate inductors. Adding such intermediate inductors is beneficial because the ON state capacitance to ground is additive. For example, using the value $C_H$ from the models shown in FIGS. 2A and 2B, in the ON state, a "stack of 1" series PCM switch has a capacitance to ground of $4*C_H$, a "stack of 2" series PCM switch has a capacitance to ground of $8*C_H$, and a "stack of 3" series PCM switch has a capacitance to ground of $12*C_H$. In the latter two cases, it is generally beneficial to add intermediate IM inductors L2' to respectively break $8*C_H$ into 2 times $4*C_H$, and break $12*C_H$ into 3 times $4*C_H$.

With the intermediate IM inductors L2', L3' in place within the modified stacked series PCM switches 304a', 304b', the IM network configuration may be a 7-element "C-L-C-L-C-L-C" arrangement: the capacitance of the ON-path shunt PCM switch 306a, IM inductor L2, the capacitance of the series PCM switch component 304a1, IM inductor L2', the capacitance of the series PCM switch component 304a2, IM inductor L1a, and the capacitance of the remaining portion of the RF switch network (i.e., the net capacitance of the OFF-branch).

Figure 12:
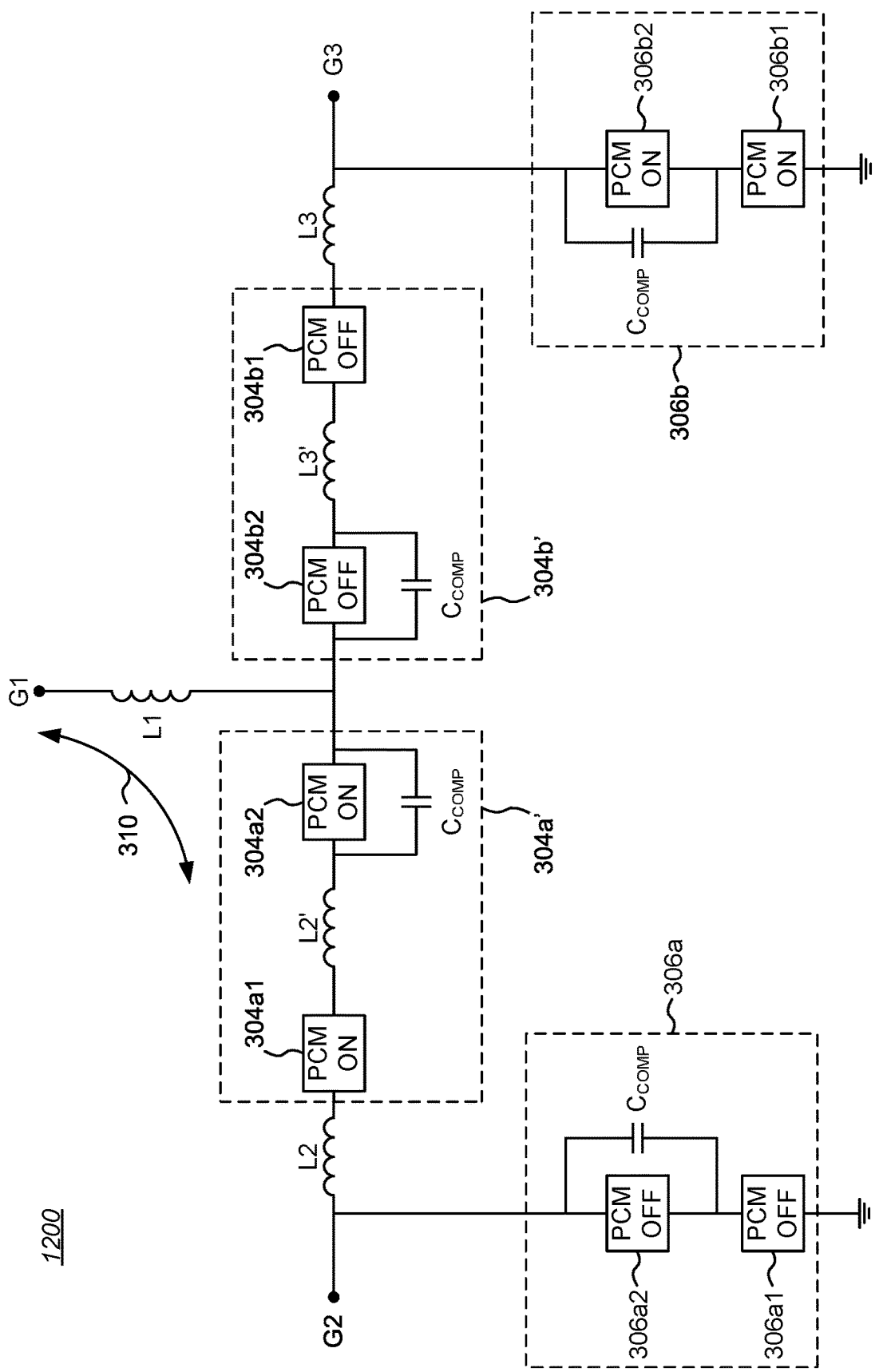
FIG. 12 is a block diagram of a third embodiment of a split-capacitance RF switch network based on stacked PCM switches.

FIG. 12 is a block diagram of a third embodiment of a split-capacitance RF switch network 1200 based on stacked PCM switches. The illustrated embodiment is similar in most respects to FIG. 11, except that the parallel IM inductors L1a and L1b of FIG. 11 have been replaced by a single IM inductor L1 coupled to terminal G1. The ON-path IM network configuration may be a 6-element "C-L-C-L-C-L" arrangement: the capacitance of the ON-path shunt PCM switch 306a, IM inductor L2, the capacitance of the series PCM switch component 304a1, IM inductor L2', the capacitance of the series PCM switch component 304a2 plus the capacitance of the remaining portion of the RF switch network (i.e., the net capacitance of the OFF-branch), and IM inductor L1.

Figure 13:
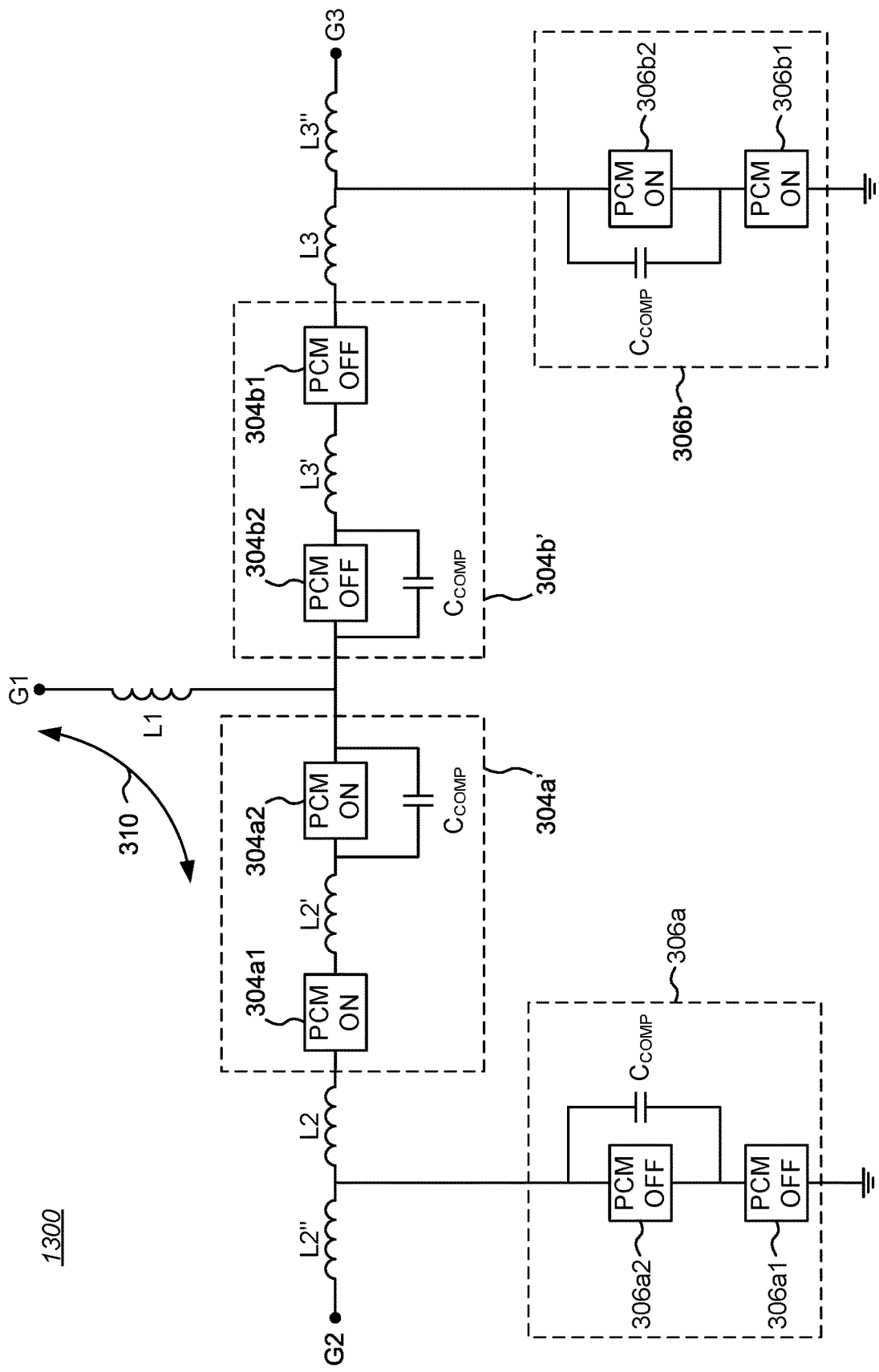
FIG. 13 is a block diagram of a fourth embodiment of a split-capacitance RF switch network based on stacked PCM switches.

FIG. 13 is a block diagram of a fourth embodiment of a split-capacitance RF switch network 1300 based on stacked PCM switches. The illustrated embodiment is similar in most respects to FIG. 12, but adds IM inductors L2" and L3" between the modified stacked series-shunt switch blocks 302a', 302b' and their respective terminals G2 and G3. The ON-path IM network configuration may be an 7-element "L-C-L-C-L-C-L" arrangement: IM inductor L2", the capacitance of the ON-path shunt PCM switch 306a, IM inductor L2, the capacitance of the series PCM switch component 304a1, IM inductor L2', the capacitance of the series PCM switch component 304a2 plus the capacitance of the remaining portion of the RF switch network (i.e., the net capacitance of the OFF-branch), and IM inductor L1.

In models of the embodiments shown in FIGS. 12 and 13, the embodiment of FIG. 13 having added IM inductors L2" and L3" at terminals G2 and G3, respectively, can be tuned to a wider bandwidth than the embodiment of FIG. 12. Tuning is essentially selecting matching inductors for a specified set of circuit capacitances so that a specified characteristic impedance (e.g., 50 Ohms) can be approximated for the RF switch network. The embodiment of FIG. 11 enhanced to add IM inductors L2" and L3" at terminals G2 and G3 would be even better because of signal path splitting via IM inductors L1a and L1b.

Figure 14:
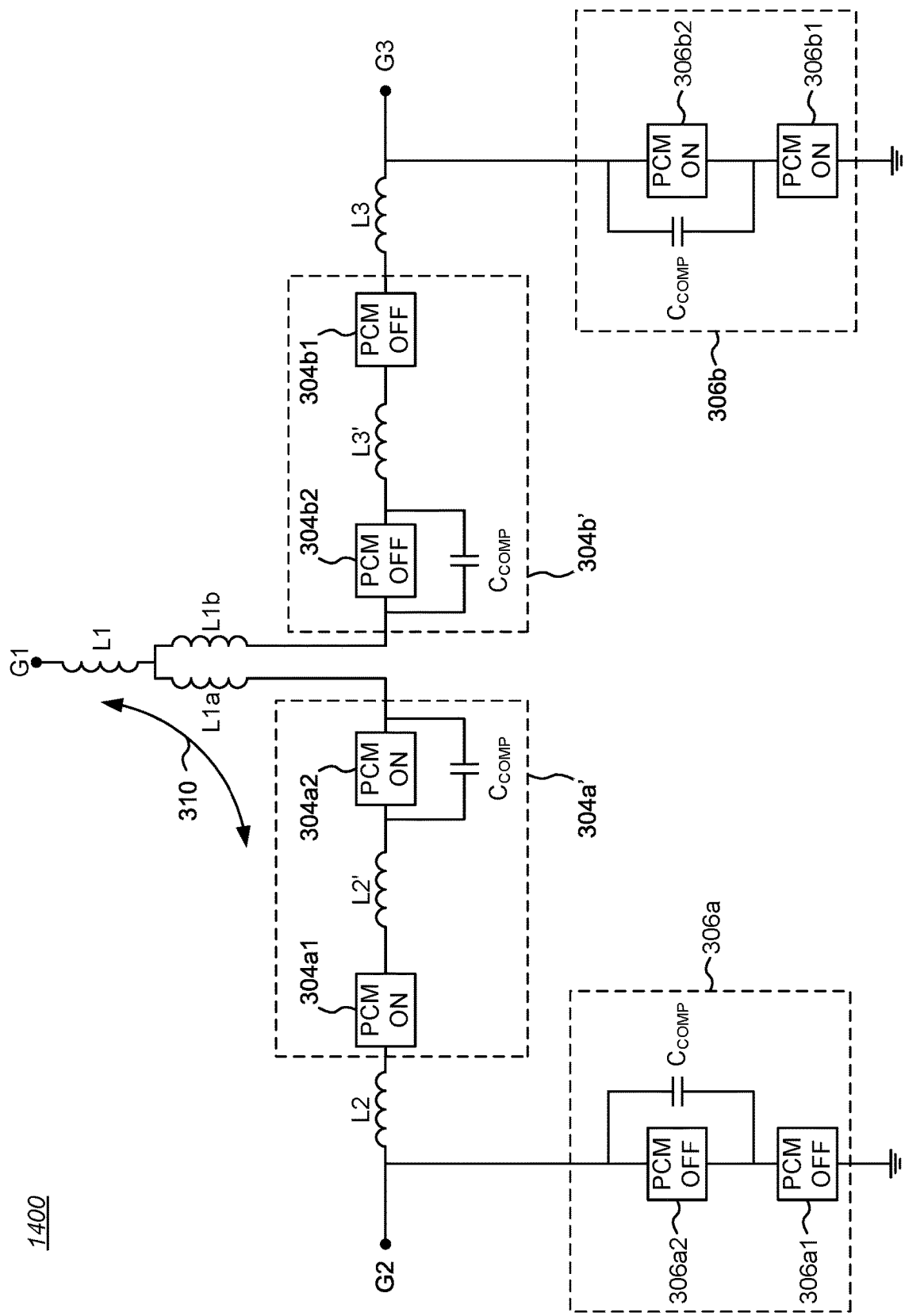
FIG. 14 is a block diagram of a fifth embodiment of a split-capacitance RF switch network based on stacked PCM switches.

FIG. 14 is a block diagram of a fifth embodiment of a split-capacitance RF switch network 1400 based on stacked PCM switches. The illustrated embodiment is similar in most respects to FIG. 11, except that an IM inductor L1 has been added between terminal G1 and the parallel IM inductors L1a and L1b. The ON-path IM network configuration may be an 8-element "C-L-C-L-C-L-C-L" arrangement: the capacitance of the ON-path shunt PCM switch 306a, IM inductor L2, the capacitance of the series PCM switch component 304a1, IM inductor L2', the capacitance of the series PCM switch component 304a2, IM inductor L1a, the capacitance of the remaining portion of the RF switch network (i.e., the net capacitance of the OFF-branch), and IM inductor L1. Note also that the configuration shown in FIG. 14 may also be implemented with non-stacked (also known as "stack of F") series PCM switches and non-stacked shunt PCM switches.

Figure 15:
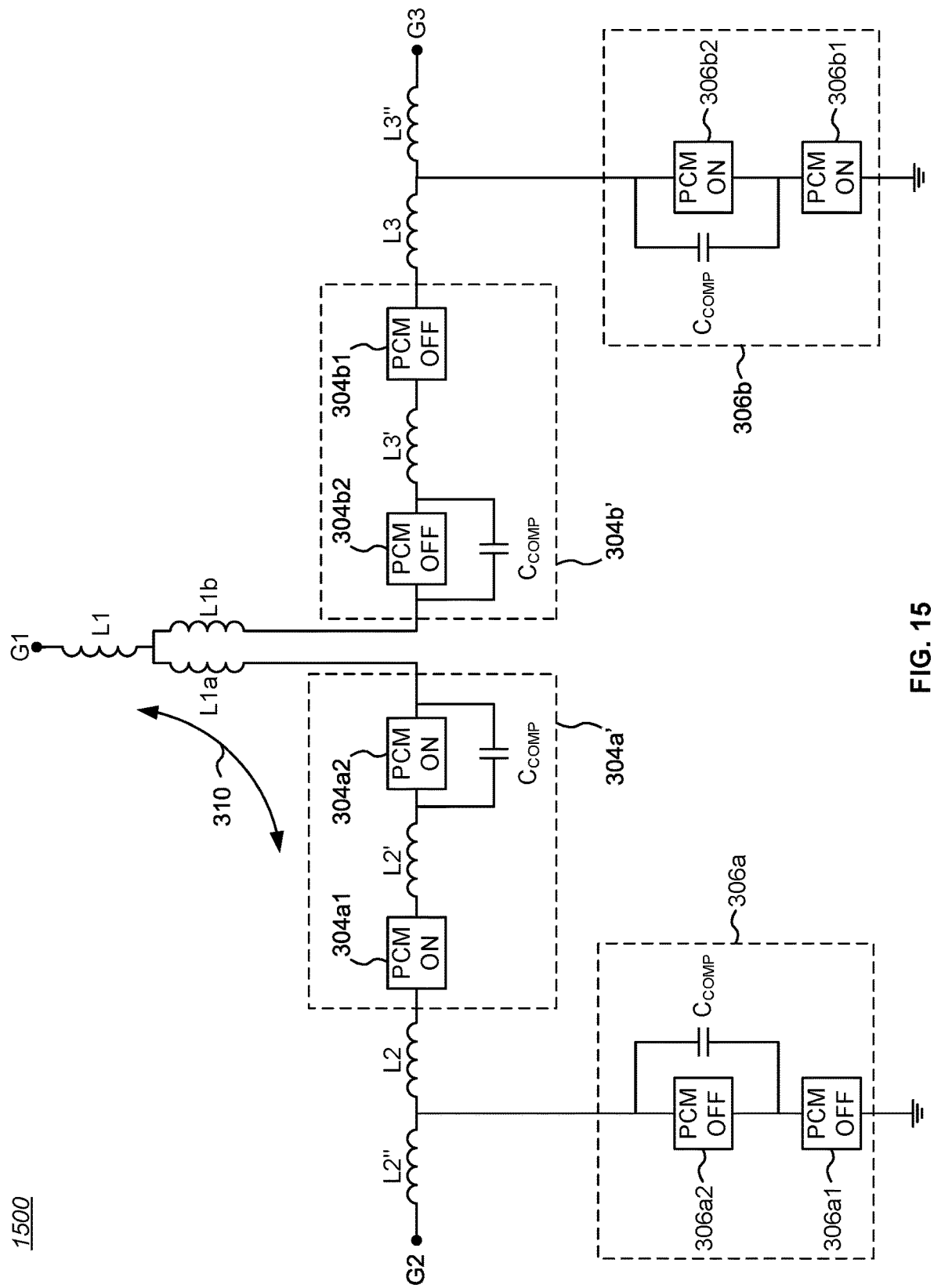
FIG. 15 is a block diagram of a sixth embodiment of a split-capacitance RF switch network based on stacked PCM switches.

FIG. 15 is a block diagram of a sixth embodiment of a split-capacitance RF switch network 1500 based on stacked PCM switches. The illustrated embodiment is similar in most respects to FIG. 14, but adds IM inductors L2" and L3" between the modified series-shunt switch blocks 302a', 302b' and their respective terminals G2 and G3. The ON-path IM network configuration may be an 9-element "L-C-L-C-L-C-L-C-L" arrangement: IM inductor L2", the capacitance of the ON-path shunt PCM switch 306a, IM inductor L2, the capacitance of the series PCM switch component 304a1, IM inductor L2', the capacitance of the series PCM switch component 304a2, IM inductor L1a, the capacitance of the remaining portion of the RF switch network (i.e., the net capacitance of the OFF-branch), and IM inductor L1.

Figure 16:
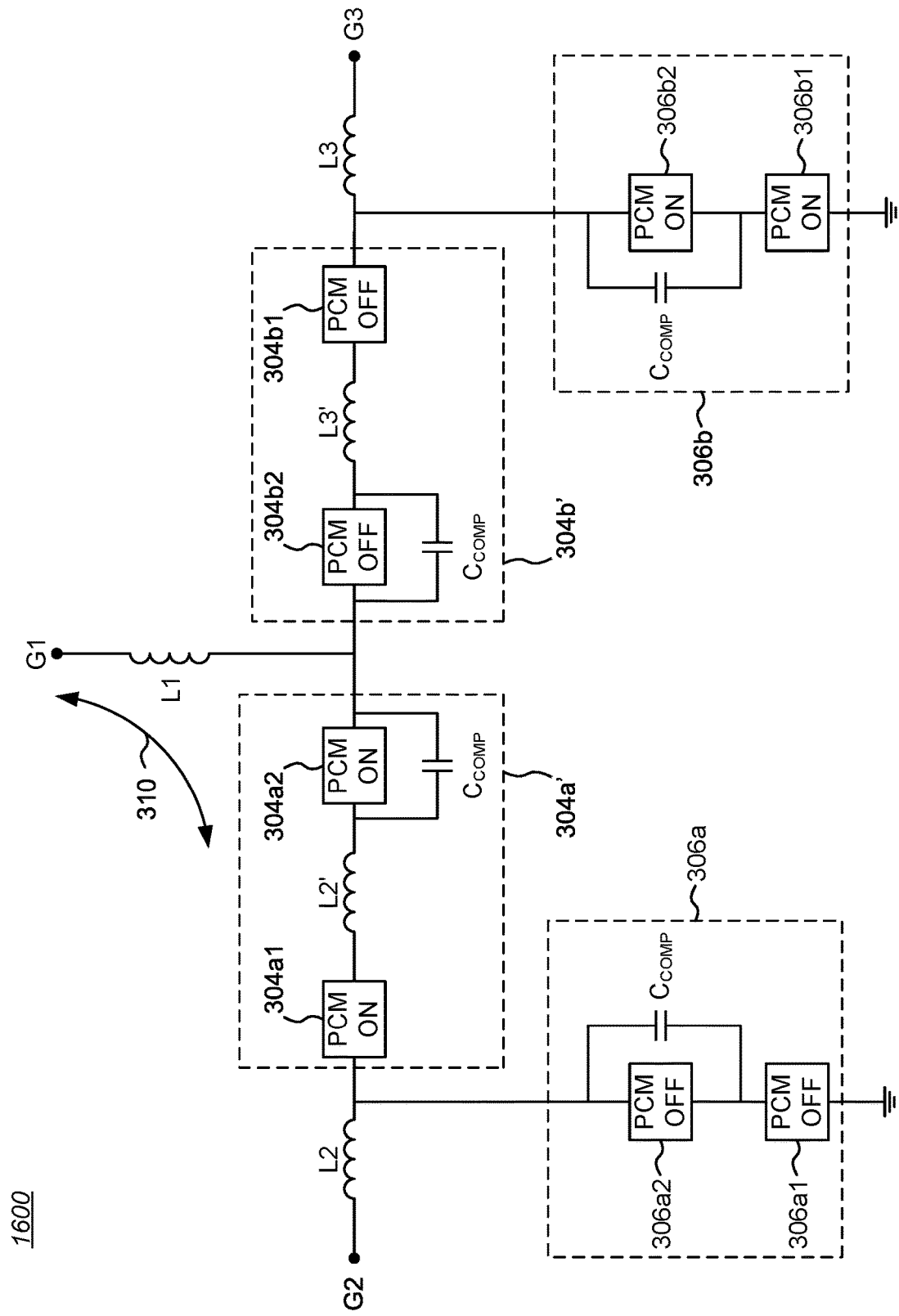
FIG. 16 is a block diagram of a seventh embodiment of a split-capacitance RF switch network based on stacked PCM switches.

Modified stacked series PCM switches that include intermediate inductors between adjacent pairs of PCM switch components may be beneficially used in conventional RF switch networks based on PCM switches. For example, FIG. 16 is a block diagram of a seventh embodiment of a split-capacitance RF switch network 1600 based on stacked PCM switches. The illustrated embodiment is similar in many respects to the conventional configuration of FIG. 3, except that the series PCM switches 304a, 304b of FIG. 3 have been replaced by modified stacked series PCM switches 304a', 304b'. The ON-path IM network configuration may be a 5-element "L-C-L-C-L" arrangement: IM inductor L2, the capacitance of the ON-path shunt PCM switch 306a and series PCM switch component 304a1, IM inductor L2', the capacitance of the series PCM switch component 304a2 and the capacitance of the remaining portion of the RF switch network (i.e., the net capacitance of the OFF-branch), and IM inductor L1.

Comparison of Example Modeled Circuits

Figure 17A:
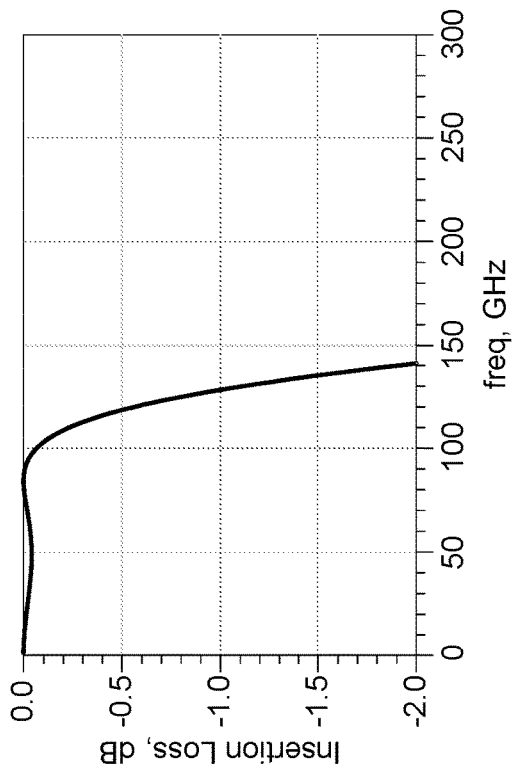
FIG. 17A is a graph of return loss as a function of frequency for a modeled embodiment of the conventional circuit shown in FIG. 3.
Figure 17B:
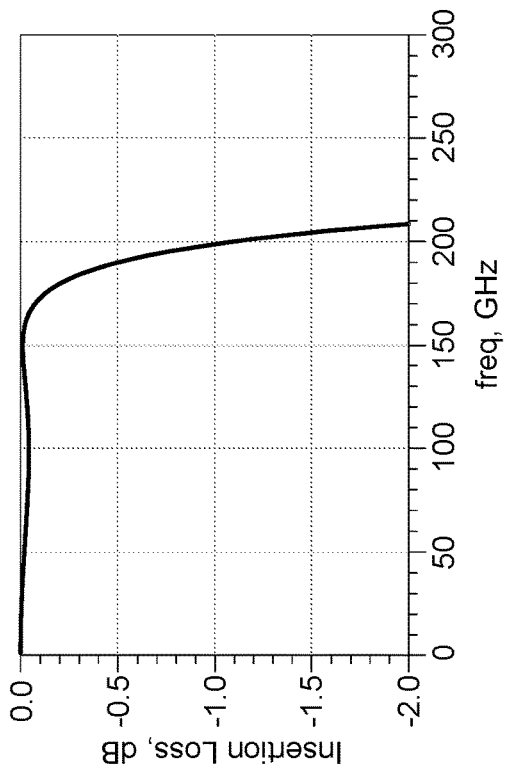
FIG. 17B is a graph of insertion loss as a function of frequency for a modeled embodiment of the prior art circuit shown in FIG. 3.

As noted above, the "split capacitance" concepts of the present disclosure result in RF switch networks having a higher bandwidth and a lower Q than prior art circuits. For example, FIG. 17A is a graph of return loss as a function of frequency for a modeled embodiment of the conventional circuit shown in FIG. 3, and FIG. 17B is a graph of insertion loss as a function of frequency for a modeled embodiment of the prior art circuit shown in FIG. 3. As FIGS. 17A and 17B show, a conventional 3-element IM matching network that lumps all of the PCM switch capacitances together results in a 20 dB return loss at about 100 GHz, where the insertion loss begins to increase substantially with frequency.

Figure 18A:
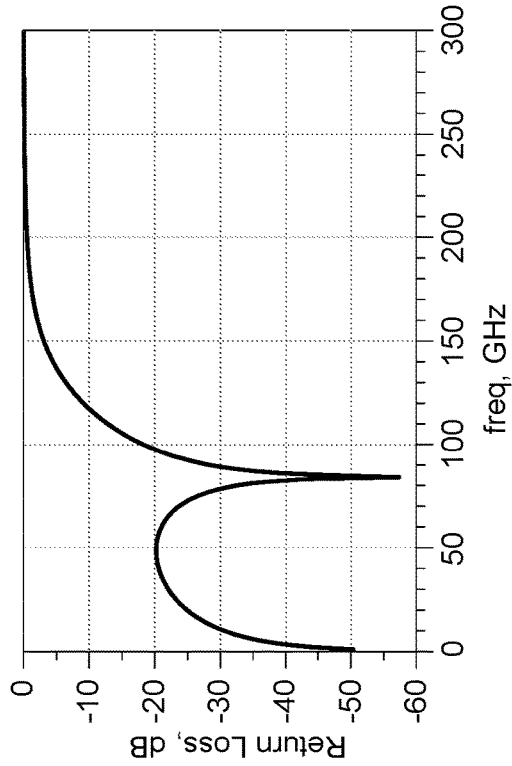
FIG. 18A is a graph of return loss as a function of frequency for a modeled embodiment of the improved circuit shown in FIG. 8.
Figure 18B:
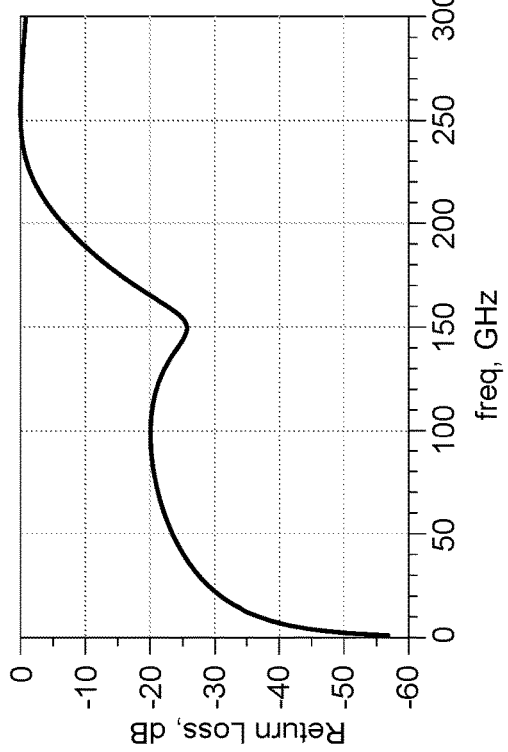
FIG. 18B is a graph of insertion loss as a function of frequency for a modeled embodiment of the prior art circuit shown in FIG. 8.

FIG. 18A is a graph of return loss as a function of frequency for a modeled embodiment of the improved circuit shown in FIG. 8, and FIG. 18B is a graph of insertion loss as a function of frequency for a modeled embodiment of the circuit shown in FIG. 8. By applying the signal-path splitting and switch-block splitting concepts described above with respect to FIG. 8, a 5-element IM matching network may be used that results in a 20 dB return loss at about 170 GHz, where the insertion loss begins to increase substantially.

Accordingly, for the example models (which both use the same assumptions regarding PCM switch ON and OFF capacitances), the 20 dB return loss performance increases from about 100 GHz using a conventional approach to IM matching networks to about 170 GHz using the signal-path splitting and switch-block splitting concepts of the present disclosure, resulting in a wider bandwidth performance.

Circuit Embodiments

As should be appreciated, the SPDT (single-pole, double-throw) RF switch networks shown in FIGS. 4-16 may be extended to include n additional terminals Gx and corresponding series-shunt switch blocks 302n or modified series-shunt switch blocks 302n' to make SPnT RF switch networks. Furthermore, some of the inventive splitting concepts may be applied to a single-pole, single-throw (SPST) switch configuration. For instance, referring to FIG. 5 as one example, a switch-block split SPST switch comprising the components between terminals G1 and G2 may include a modified series-shunt switch blocks 302a' comprising a series PCM switch 304a separated (split) from a shunt PCM switch 306a by an IM inductor L2. As another instance, referring to FIGS. 3 and 5 as examples, the series PCM switches in the series-shunt switch block 302a of FIG. 3 or the modified series-shunt switch block 302a' of FIG. 5 may be replaced by stacked series PCM switches having an intermediate IM inductor between adjacent PCM switch components, as in FIG. 11. These two configurations may be combined, resulting in an SPST with a split switch-block having stacked series PCM switches.

The various inductors shown in FIGS. 4-16 may be external to an IC implementation of the disclosed circuits (i.e., off-chip), but preferably are inductances fabricated as part of the IC (i.e., on-chip), such as high impedance (e.g., narrow) transmission lines.

Figure 19:
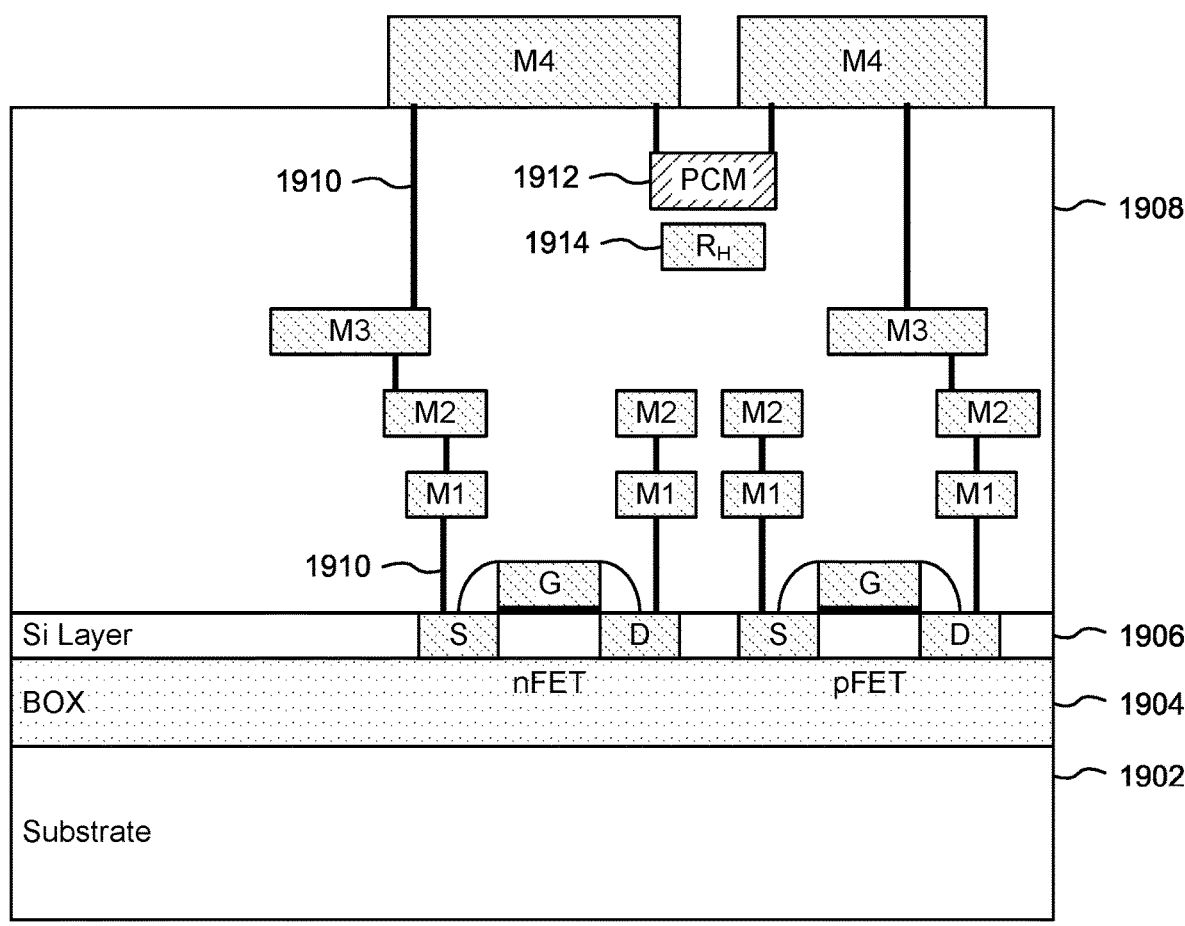
FIG. 19 is a cross-section diagram of an SOI IC that includes a PCM switch.

A number of characteristics of PCM switches make them highly useful as RF switches. For example, PCM switches are physically small (smaller than FET switches), have power consumption on par with FET switches at low switching rates (e.g., 10 Hz), are non-volatile (thus not requiring power to maintain a switch state), and may be readily integrated into ICs made with a number of fabrication processes. In particular, PCM switches may be integrated with silicon-on-insulator (SOI) FET devices (at type of MOSFET). For example, FIG. 19 is a cross-section diagram 1900 of an SOI IC that includes a PCM switch. A substrate 1902 supports a buried oxide (BOX) insulator layer 1904, which in turn supports an active layer 1906. In the illustrated example, an nFET and a pFET are formed in and on the active layer 1906. Each FET includes a source S, drain D, and gate G. A superstructure 1908 is formed on the active layer 1906, and generally comprises inter-layer dielectric (ILD) with formed layers of metallization (e.g., M1, M2, M3, with M4 on top, but noting that more or fewer metallization layers may be used), and vertical conductors (vias) 1910. In the illustrated example, the superstructure 1908 also includes a PCM region 1912 with an adjacent resistive heater $R_H$ 1914.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit components or blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

Figure 20:
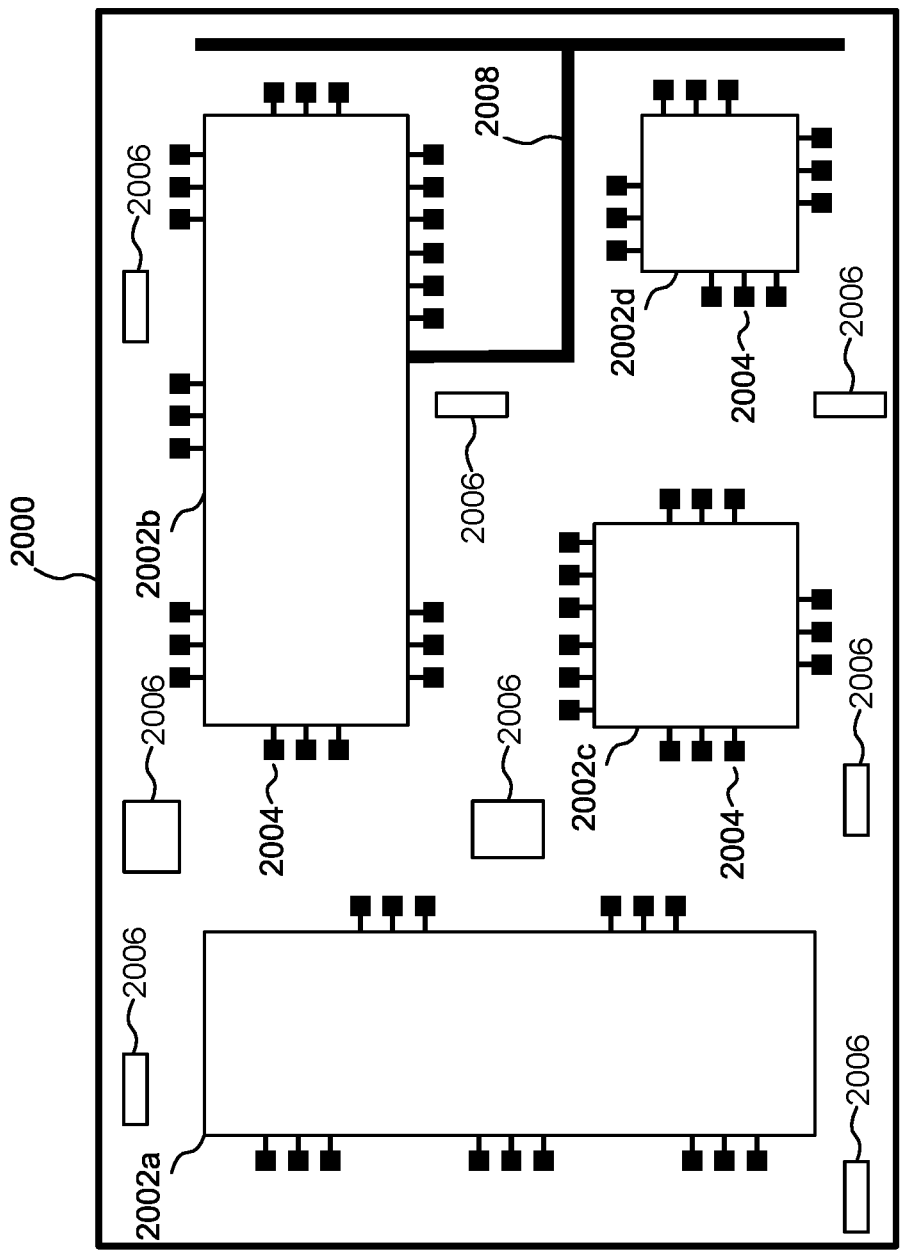
FIG. 20 is a top plan view of a substrate that may be, for example, a printed circuit board or chip module substrate (e.g., a thin-film tile).

As one example of further integration of embodiments of the present invention with other components, FIG. 20 is a top plan view of a substrate 2000 that may be, for example, a printed circuit board or chip module substrate (e.g., a thin-film tile). In the illustrated example, the substrate 2000 includes multiple ICs 2002a-2002d having terminal pads 2004 which would be interconnected by conductive vias and/or traces on and/or within the substrate 2000 or on the opposite (back) surface of the substrate 2000 (to avoid clutter, the surface conductive traces are not shown and not all terminal pads are labelled). The ICs 2002a-2002d may embody, for example, signal switches, active filters, amplifiers (including one or more LNAs), and other circuitry. For example, IC 2002b may incorporate one or more instances of an IC that includes one or more PCM switches in accordance with the present invention.

The substrate 2000 may also include one or more passive devices 2006 embedded in, formed on, and/or affixed to the substrate 2000. While shown as generic rectangles, the passive devices 2006 may be, for example, filters, capacitors, inductors, transmission lines, resistors, planar antennae elements, transducers (including, for example, MEMS-based transducers, such as accelerometers, gyroscopes, microphones, pressure sensors, etc.), batteries, etc., interconnected by conductive traces on or in the substrate 2000 to other passive devices 2006 and/or the individual ICs 2002a-2002d.

The front or back surface of the substrate 2000 may be used as a location for the formation of other structures. For example, one or more antennae may be formed on or affixed to the front or back surface of the substrate 2000; one example of a front-surface antenna 2008 is shown, coupled to an IC die 2002b, which may include RF front-end circuitry. Thus, by including one or more antennae on the substrate 2000, a complete radio may be created.

Note that in some applications, it may be beneficial to utilize parasitic capacitances and/or inductances (at least in part) in implementing effective compensating capacitances or inductances. Thus, while it may be desirable to reduce or cancel such parasitic capacitances and/or inductances in some portions of a circuit, in other portions of the circuit it may be useful to take advantage of the existence of such parasitic capacitances and/or inductances to provide desired functionality and/or reduce the size and/or number of designed-in capacitances and/or inductances.

System Aspects

Embodiments of the present invention are useful in a wide variety of larger radio frequency (RF) circuits and systems for performing a range of functions. Such functions are useful in a variety of applications, such as radar systems (including phased array and automotive radar systems), radio systems (including cellular radio systems), and test equipment.

Radio system usage includes wireless RF systems (including base stations, relay stations, and hand-held transceivers) that use various technologies and protocols, including various types of orthogonal frequency-division multiplexing ("OFDM"), quadrature amplitude modulation ("QAM"), Code-Division Multiple Access ("CDMA"), Time-Division Multiple Access ("TDMA"), Wide Band Code Division Multiple Access ("W-CDMA"), Global System for Mobile Communications ("GSM"), Long Term Evolution ("LTE"), 5G, 6G, and WiFi (e.g., 802.11a, b, g, ac, ax, be), as well as other radio communication standards and protocols.

Figure 21:
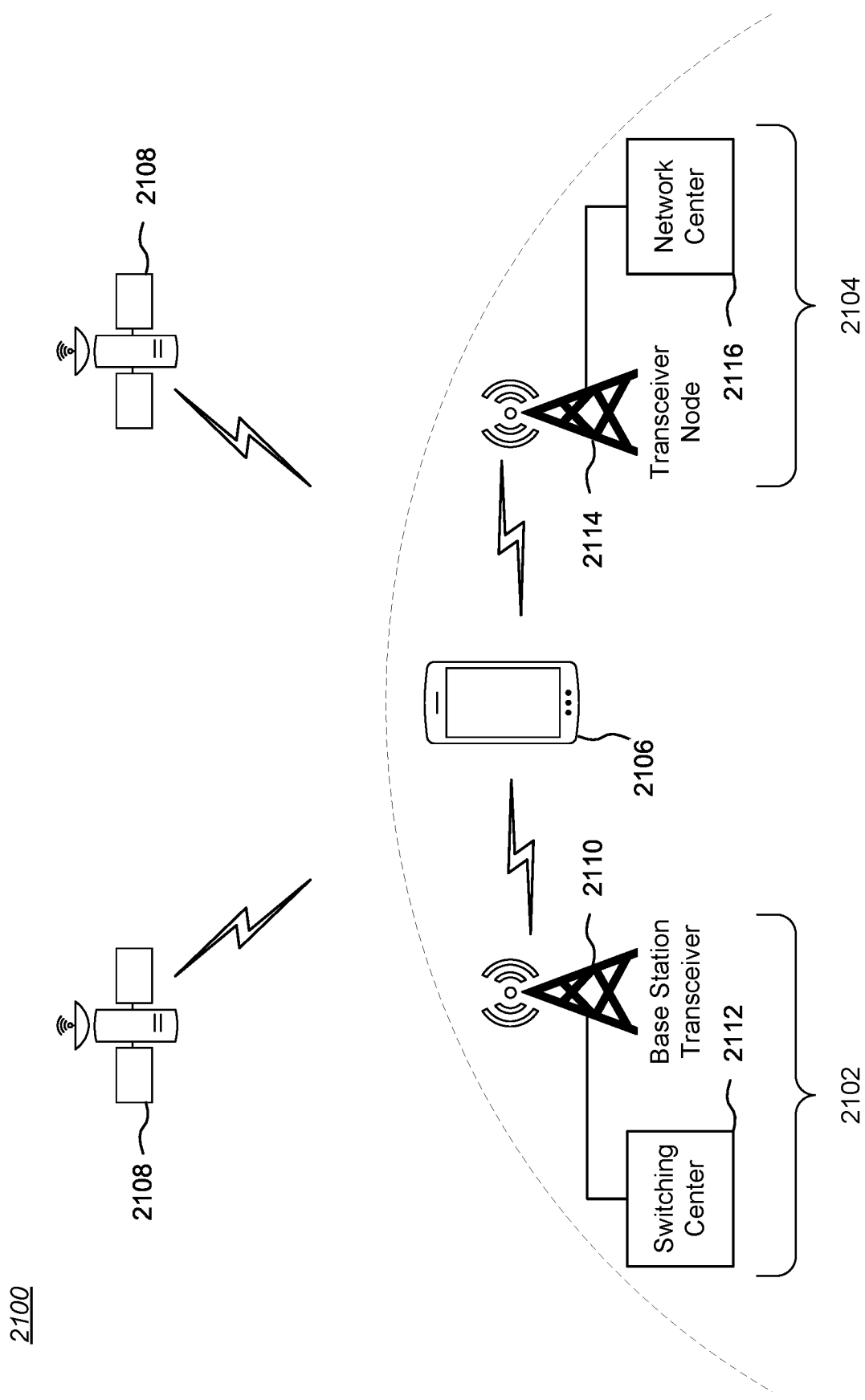
FIG. 21 illustrates an exemplary prior art wireless communication environment comprising different wireless communication systems, and which may include one or more mobile wireless devices.

As an example of wireless RF system usage, FIG. 21 illustrates an exemplary prior art wireless communication environment 2100 comprising different wireless communication systems 2102 and 2104, and which may include one or more mobile wireless devices 2106.

A wireless device 2106 may be capable of communicating with multiple wireless communication systems 2102, 2104 using one or more of the telecommunication protocols noted above. A wireless device 2106 also may be capable of communicating with one or more satellites 2108, such as navigation satellites (e.g., GPS) and/or telecommunication satellites. The wireless device 2106 may be equipped with multiple antennas, externally and/or internally, for operation on different frequencies and/or to provide diversity against deleterious path effects such as fading and multi-path interference. A wireless device 2106 may be a cellular phone, a personal digital assistant (PDA), a wireless-enabled computer or tablet, or some other wireless communication unit or device. A wireless device 2106 may also be referred to as a mobile station, user equipment, an access terminal, or some other terminology.

The wireless system 2102 may be, for example, a CDMA-based system that includes one or more base station transceivers (BSTs) 2110 and at least one switching center (SC) 2112. Each BST 2110 provides over-the-air RF communication for wireless devices 2106 within its coverage area. The SC 2112 couples to one or more BSTs in the wireless system 2102 and provides coordination and control for those BSTs.

The wireless system 2104 may be, for example, a TDMA-based system that includes one or more transceiver nodes 2114 and a network center (NC) 2116. Each transceiver node 2114 provides over-the-air RF communication for wireless devices 2106 within its coverage area. The NC 2116 couples to one or more transceiver nodes 2114 in the wireless system 2104 and provides coordination and control for those transceiver nodes 2114.

In general, each BST 2110 and transceiver node 2114 is a fixed station that provides communication coverage for wireless devices 2106, and may also be referred to as base stations or some other terminology. The SC 2112 and the NC 2116 are network entities that provide coordination and control for the base stations and may also be referred to by other terminologies.

Figure 22:
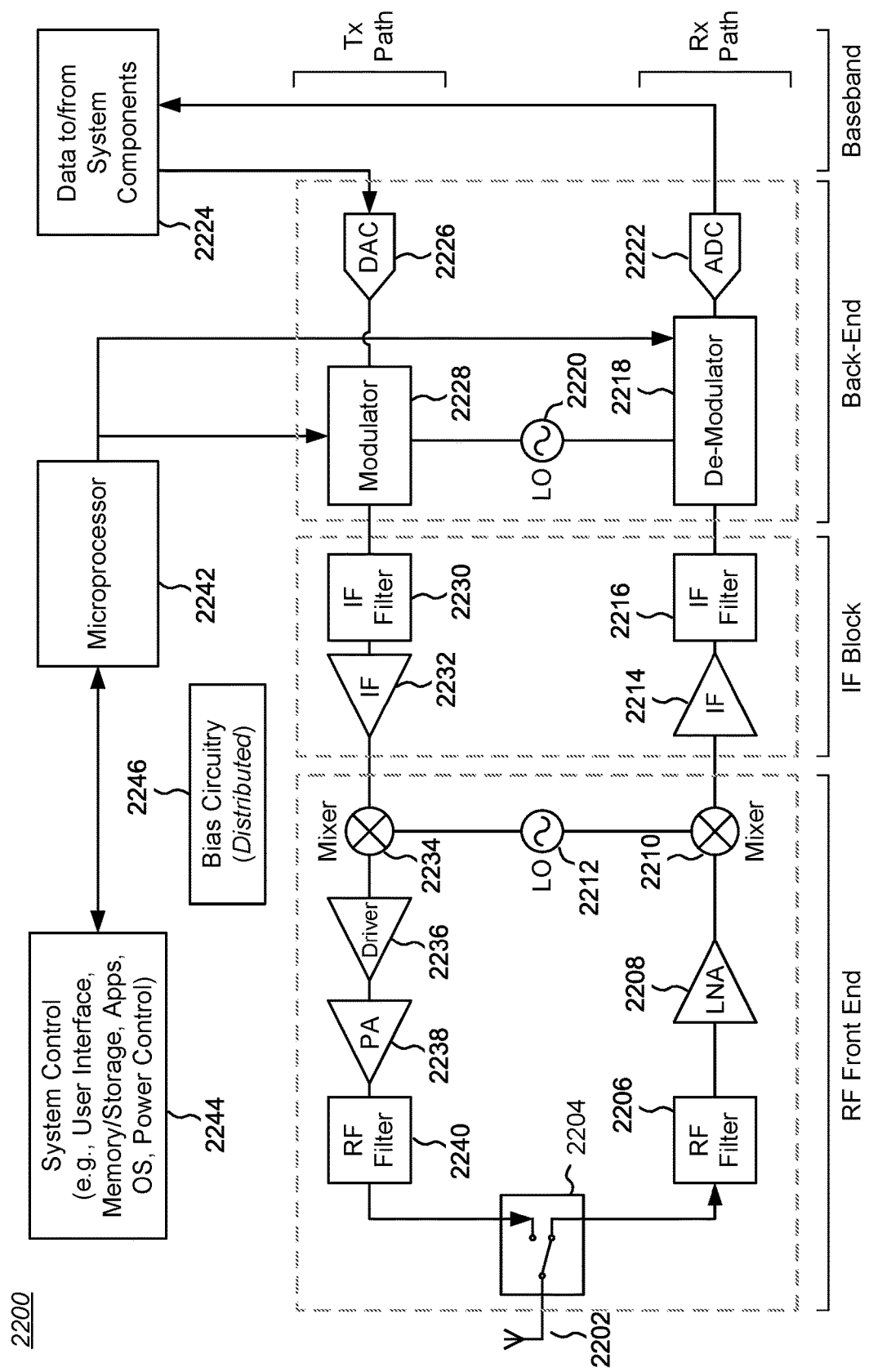
FIG. 22 is a block diagram of a transceiver that might be used in a wireless device, such as a cellular telephone, and which may beneficially incorporate an embodiment of the present invention for improved performance (e.g., high bandwidth).

An important aspect of any wireless system, including the systems shown in FIG. 21, is in the details of how the component elements of the system perform. FIG. 22 is a block diagram of a transceiver 2200 that might be used in a wireless device, such as a cellular telephone, and which may beneficially incorporate an embodiment of the present invention for improved performance (e.g., high bandwidth). As illustrated, the transceiver 2200 includes a mix of RF analog circuitry for directly conveying and/or transforming signals on an RF signal path, non-RF analog circuity for operational needs outside of the RF signal path (e.g., for bias voltages and switching signals), and digital circuitry for control and user interface requirements. In this example, a receiver path Rx includes RF Front End, IF Block, Back-End, and Baseband sections (noting that in some implementations, the differentiation between sections may be different).

The receiver path Rx receives over-the-air RF signals through an antenna 2202 and a switching unit 2204, which may be implemented with active switching devices (e.g., field effect transistors or FETs, or a PCM-based RF switch network in accordance with the present disclosure), or with passive devices that implement frequency-domain multiplexing, such as a diplexer or duplexer. An RF filter 2206 passes desired received RF signals to a low noise amplifier (LNA) 2208, the output of which is combined in a mixer 2210 with the output of a first local oscillator 2212 to produce an intermediate frequency (IF) signal. The IF signal may be amplified by an IF amplifier 2214 and subjected to an IF filter 2216 before being applied to a demodulator 2218, which may be coupled to a second local oscillator 2220. The demodulated output of the demodulator 2218 is transformed to a digital signal by an analog-to-digital converter 2222 and provided to one or more system components 2224 (e.g., a video graphics circuit, a sound circuit, memory devices, etc.). The converted digital signal may represent, for example, video or still images, sounds, or symbols, such as text or other characters.

In the illustrated example, a transmitter path Tx includes Baseband, Back-End, IF Block, and RF Front End sections (again, in some implementations, the differentiation between sections may be different). Digital data from one or more system components 2224 is transformed to an analog signal by a digital-to-analog converter 2226, the output of which is applied to a modulator 2228, which also may be coupled to the second local oscillator 2220. The modulated output of the modulator 2228 may be subjected to an IF filter 2230 before being amplified by an IF amplifier 2232. The output of the IF amplifier 2232 is then combined in a mixer 2234 with the output of the first local oscillator 2212 to produce an RF signal. The RF signal may be amplified by a driver 2236, the output of which is applied to a power amplifier (PA) 2238. The amplified RF signal may be coupled to an RF filter 2240, the output of which is coupled to the antenna 2202 through the switching unit 2204.

The operation of the transceiver 2200 is controlled by a microprocessor 2242 in known fashion, which interacts with system control components (e.g., user interfaces, memory/storage devices, application programs, operating system software, power control, etc.). In addition, the transceiver 2200 will generally include other circuitry, such as bias circuitry 2246 (which may be distributed throughout the transceiver 2200 in proximity to transistor devices), electrostatic discharge (ESD) protection circuits, testing circuits (not shown), factory programming interfaces (not shown), etc.

In modern transceivers, there are often more than one receiver path Rx and transmitter path Tx, for example, to accommodate multiple frequencies and/or signaling modalities. Further, as should be apparent to one of ordinary skill in the art, some components of the transceiver 2200 may be positioned in a different order (e.g., filters) or omitted. Other components can be (and usually are) added (e.g., additional filters, impedance matching networks, variable phase shifters/attenuators, power dividers, etc.).

Methods

Figure 23:
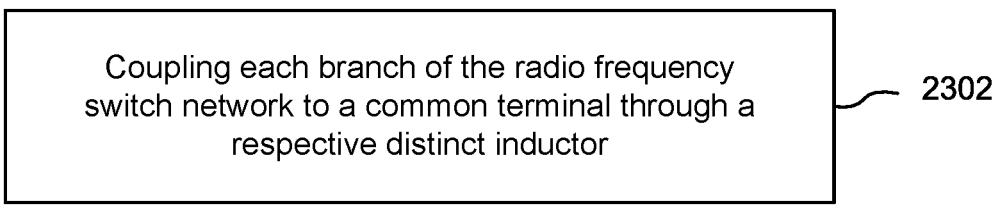
FIG. 23 is a process flow chart showing a first method for matching an RF switch network that includes a plurality of branches each including at least one PCM switch.

Another aspect of the invention includes methods for impedance matching a radio frequency switch network that includes a plurality of branches each including at least one phase change material (PCM) switch. For example, FIG. 23 is a process flow chart 2300 showing a first method for matching an RF switch network that includes a plurality of branches each including at least one PCM switch. The method includes coupling each branch of the radio frequency switch network to a common terminal through a respective distinct inductor (Block 2302).

Figure 24:
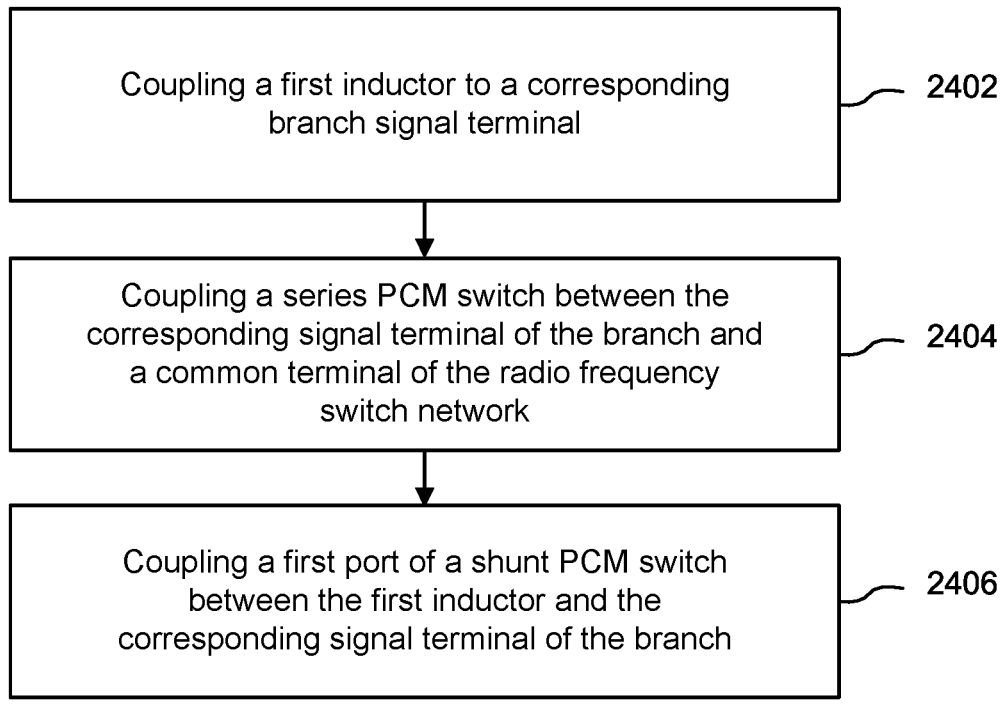
FIG. 24 is a process flow chart showing a second method for matching an RF switch network that includes a plurality of branches each including at least one PCM switch.

As another example, FIG. 24 is a process flow chart 2400 showing a second method for matching an RF switch network that includes a plurality of branches each including at least one PCM switch. The method includes, for each branch, coupling a first inductor to a corresponding branch signal terminal (Block 2402); coupling a series PCM switch between the corresponding signal terminal of the branch and a common terminal of the radio frequency switch network (Block 2404); and coupling a first port of a shunt PCM switch between the first inductor and the corresponding signal terminal of the branch (Block 2406).

Figure 25:
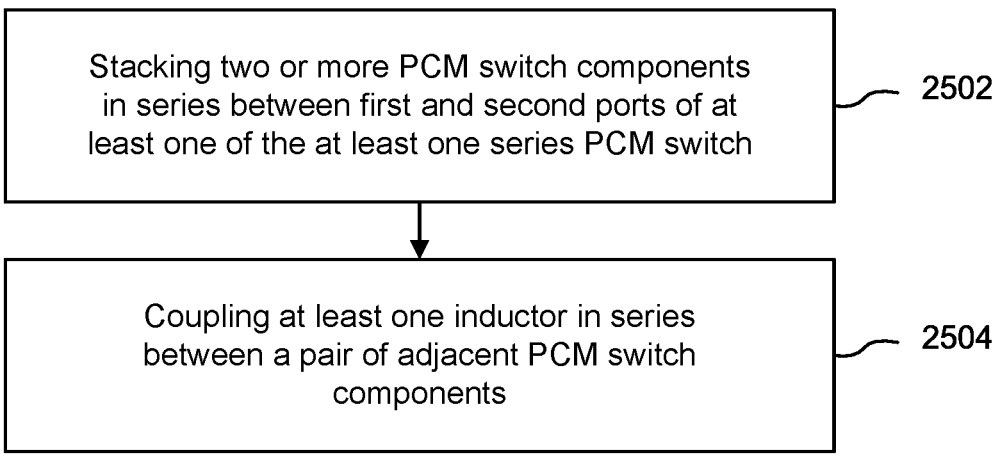
FIG. 25 is a process flow chart showing a third method for matching an RF switch network that includes a plurality of branches each including at least one series PCM switch.

As still example, FIG. 25 is a process flow chart 2500 showing a third method for matching an RF switch network that includes a plurality of branches each including at least one series PCM switch. The method includes, stacking two or more PCM switch components in series between first and second ports of at least one of the at least one series PCM switch (Block 2502); and coupling at least one inductor in series between a pair of adjacent PCM switch components (Block 2504).

Additional aspects of the above method may include combining one or more of the methods of FIGS. 23, 24, and/or 25. Further, additional IM inductors L may be inserted between other parasitic capacitances C caused by layout discontinuities.

Fabrication Technologies & Options

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

With respect to the figures referenced in this disclosure, the dimensions for the various elements are not to scale; some dimensions have been greatly exaggerated vertically and/or horizontally for clarity or emphasis. In addition, references to orientations and directions (e.g., "top", "bottom", "above", "below", "lateral", "vertical", "horizontal", etc.) are relative to the example drawings, and not necessarily absolute orientations or directions.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

CONCLUSION

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

What is claimed is:

1. A radio frequency switch network having a split signal-path impedance matching network, including:
   (a) a common terminal;
   (b) at least two branches, each branch including:
      (1) a first inductor coupled to the common terminal;
      (2) a second inductor coupled to a corresponding signal terminal; and
      (3) a series-shunt phase change material switch block coupled between the first inductor and the second inductor, and connected to a reference voltage;
   wherein each branch defines a switchable signal path between the common terminal and the corresponding signal terminal.

2. The invention of claim 1, wherein each series-shunt phase change material (PCM) switch block includes:
   (a) a series PCM switch including first and second ports; and
   (b) a shunt PCM switch including first and second ports, the first port of the shunt PCM switch coupled to the first port of the series PCM switch and the second port of the shunt PCM switch configured to be coupled to a reference voltage.

3. The invention of claim 1, wherein at least one series-shunt phase change material (PCM) switch block includes:
   (a) a series PCM switch including first and second ports and comprising a stack of two or more PCM switch components coupled in series between the first and second ports; and
   (b) a shunt PCM switch including first and second ports and comprising a stack of two or more PCM switch components coupled in series between the first and second ports of the shunt PCM, the first port of the shunt PCM switch coupled to the first port of the series PCM switch and the second port of the shunt PCM switch configured to be coupled to a reference voltage.

4. The invention of claim 1, wherein at least one series-shunt phase change material switch block includes:
   (a) a series PCM switch including first and second ports and comprising a stack of two or more PCM switch components coupled in series between the first and second ports and at least one inductor coupled in series between a pair of adjacent PCM switch components; and
   (b) a shunt PCM switch including first and second ports and comprising a stack of two or more PCM switch components coupled in series between the first and second ports of the shunt PCM, the first port of the shunt PCM switch coupled to the first port of the series PCM switch and the second port of the shunt PCM switch configured to be coupled to a reference voltage.

5. A radio frequency switch network having a split-block impedance matching network, including:
   (a) a common terminal;
   (b) at least two branches, each branch including:
      (1) a first inductor coupled to a corresponding signal terminal;
      (2) a series phase change material (PCM) switch coupled between the common terminal and the first inductor; and
      (3) a shunt PCM switch including first and second ports, the first port coupled between the first inductor and the corresponding signal terminal of the branch, and the second port configured to be coupled to a reference voltage.

6. The invention of claim 5, further including an inductor coupled between the common terminal and the series PCM switch of the at least two branches.

7. The invention of claim 6, wherein:
   (a) at least one series PCM switch includes first and second ports and a stack of two or more PCM switch components coupled in series between the first and second ports; and
   (b) at least one shunt PCM switch includes a stack of two or more PCM switch components coupled in series between the first and second ports of the shunt PCM switch.

8. The invention of claim 6, wherein at least one series PCM switch includes:
   (a) first and second ports and a stack of two or more PCM switch components coupled in series between the first and second ports; and
   (b) at least one inductor coupled in series between a pair of adjacent PCM switch components.

9. The invention of claim 5, each branch further including a second inductor coupled between the first port of the shunt PCM switch and the corresponding signal terminal of the branch.

10. The invention of claim 9, wherein:
    (a) at least one series PCM switch includes first and second ports and a stack of two or more PCM switch components coupled in series between the first and second ports; and
    (b) at least one shunt PCM switch includes a stack of two or more PCM switch components coupled in series between the first and second ports of the shunt PCM switch.

11. The invention of claim 9, wherein at least one series PCM switch includes:
    (a) first and second ports and a stack of two or more PCM switch components coupled in series between the first and second ports; and
    (b) at least one inductor coupled in series between a pair of adjacent PCM switch components.

12. The invention of claim 5, further including:
    (a) a first added inductor coupled between the common terminal and the series PCM switch of the at least two branches; and
    (b) a second added inductor coupled between the first port of the shunt PCM switch and the corresponding signal terminal of the branch.

13. The invention of claim 12, wherein:
(a) at least one series PCM switch includes first and second ports and a stack of two or more PCM switch components coupled in series between the first and second ports; and
(b) at least one shunt PCM switch includes a stack of two or more PCM switch components coupled in series between the first and second ports of the shunt PCM switch.

14. The invention of claim 12, wherein at least one series PCM switch includes:
(a) first and second ports and a stack of two or more PCM switch components coupled in series between the first and second ports; and
(b) at least one inductor coupled in series between a pair of adjacent PCM switch components.

15. The invention of claim 5, wherein:
(a) at least one series PCM switch includes first and second ports and a stack of two or more PCM switch components coupled in series between the first and second ports; and
(b) at least one shunt PCM switch includes a stack of two or more PCM switch components coupled in series between the first and second ports of the shunt PCM switch.

16. The invention of claim 5, wherein at least one series PCM switch includes:
(a) first and second ports and a stack of two or more PCM switch components coupled in series between the first and second ports; and
(b) at least one inductor coupled in series between a pair of adjacent PCM switch components.

17. A radio frequency switch network having a split signal-path and a split-block impedance matching network, including:
(a) a common terminal;
(b) at least two branches, each branch including:
  (1) a first inductor coupled to the common terminal;
  (2) a second inductor coupled to a corresponding signal terminal;
  (3) a series phase change material (PCM) switch coupled between the first inductor and the second inductor; and
  (4) a shunt PCM switch including first and second ports, the first port coupled between the second inductor and the corresponding signal terminal of the branch, and the second port of the shunt PCM switch configured to be coupled to a reference voltage.

18. The invention of claim 17, each branch further including a third inductor coupled between the first port of the shunt PCM switch and the corresponding signal terminal of the branch.

19. The invention of claim 17, wherein:
(a) at least one series PCM switch includes first and second ports and a stack of two or more PCM switch components coupled in series between the first and second ports; and
(b) at least one shunt PCM switch includes a stack of two or more PCM switch components coupled in series between the first and second ports of the shunt PCM switch.

20. The invention of claim 17, wherein at least one series PCM switch includes:
(a) first and second ports and a stack of two or more PCM switch components coupled in series between the first and second ports; and
(b) at least one inductor coupled in series between a pair of adjacent PCM switch components.

* * * * *